United States Patent
Matsuo

(10) Patent No.: US 12,117,478 B2
(45) Date of Patent: Oct. 15, 2024

(54) CAPACITOR INSPECTION METHOD AND INSPECTION APPARATUS USED FOR SAME

(71) Applicant: YURI HOLDINGS CO., LTD., Akita (JP)

(72) Inventor: Reijiro Matsuo, Akita (JP)

(73) Assignee: YURI HOLDINGS CO., LTD., Akita (JP)

( * ) Notice: Subject to any disclaimer, the term of this patent is extended or adjusted under 35 U.S.C. 154(b) by 0 days.

(21) Appl. No.: 18/370,581

(22) Filed: Sep. 20, 2023

(65) Prior Publication Data
US 2024/0103062 A1  Mar. 28, 2024

(30) Foreign Application Priority Data
Sep. 21, 2022 (JP) .................. 2022-150772

(51) Int. Cl.
*G01R 31/01* (2020.01)
*G01R 27/26* (2006.01)
*G01R 31/64* (2020.01)

(52) U.S. Cl.
CPC ....... *G01R 31/016* (2013.01); *G01R 27/2605* (2013.01); *G01R 31/64* (2020.01); *G01R 27/26* (2013.01)

(58) Field of Classification Search
CPC ........ G01R 27/00; G01R 27/02; G01R 27/26; G01R 27/2605; G01R 31/00; G01R 31/01; G01R 31/016; G01R 31/50; G01R 31/64

USPC ........................................ 324/500, 537, 548
See application file for complete search history.

(56) References Cited

FOREIGN PATENT DOCUMENTS

| CN | 104169728 B | * | 11/2016 | ............. G01B 7/003 |
| CN | 108352779 A | * | 7/2018 | ........... G01R 31/028 |
| JP | 61-108956 | | 5/1986 | |
| JP | 6-18462 | | 1/1994 | |
| JP | 7-174802 | | 7/1995 | |
| JP | 2003043098 A | * | 2/2003 | ............. G01R 31/18 |
| JP | 7147093 B1 | * | 10/2022 | ............. G01R 31/00 |
| TW | 202349853 A | * | 12/2023 | ............. G01R 31/40 |

OTHER PUBLICATIONS

Office Action issued Mar. 8, 2024 in Japanese Application No. 2023-152404 (with English translation).

* cited by examiner

*Primary Examiner* — Hoai-An D. Nguyen
(74) *Attorney, Agent, or Firm* — Wenderoth, Lind & Ponack, L.L.P.

(57) ABSTRACT

A method of inspection for a group of a same type of capacitors includes:
a step of applying a DC bias voltage equal to or lower than the rated value of the group to a capacitor; and a vibration response voltage generating step of inputting an electric signal whose frequency continuously changes with time to a capacitor, causing mechanical vibration in the capacitor, generating a vibration response voltage from the capacitor, and outputting superposition of the DC bias voltage and the vibration response voltage as reaction voltage.

12 Claims, 17 Drawing Sheets

FIG. 14
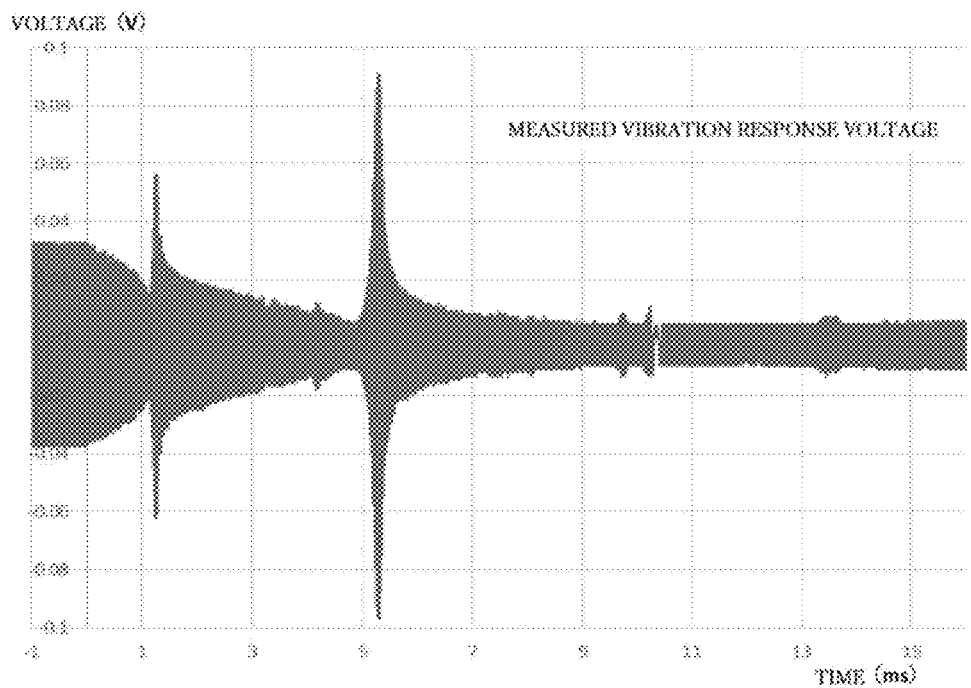
FIG. 14A
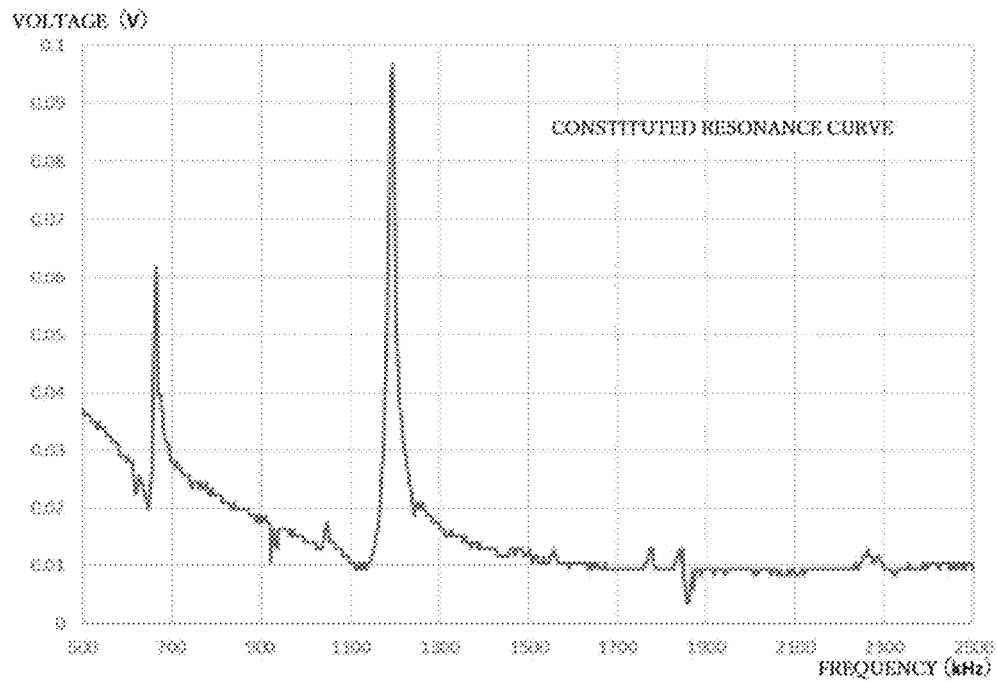
FIG. 14B

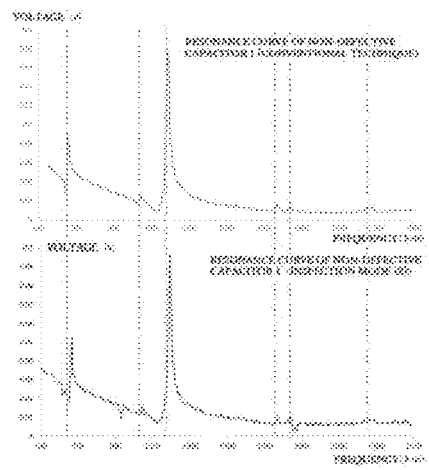
FIG. 15A-1
FIG. 15A-2
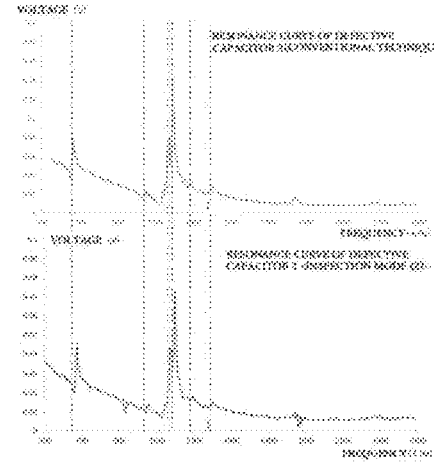
FIG. 15B-1
FIG. 15B-2
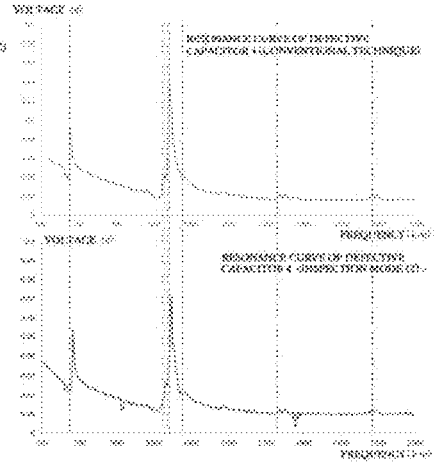
FIG. 15C-1
FIG. 15C-2

CAPACITOR INSPECTION METHOD AND INSPECTION APPARATUS USED FOR SAME

TECHNICAL FIELD

The present invention relates to a capacitor inspection method and an inspection apparatus used for the method.

BACKGROUND ART

Ceramic chip capacitors are small in size, high in reliability, and have large capacitance rating. Hence, they are mounted on almost all electronic devices and medical devices nowadays. However, ceramic capacitors are prone to mechanical defects (electrode abnormality, lamination displacement, void, crack) or the like, and often these defects are not identifiable with appearance inspection.

At the production site, in order to exclude such defective pieces and ensure high reliability of capacitors, various nondestructive electrical characteristic tests such as capacitance measurement, insulation resistance, tan δ, and pulse withstand voltage are conducted.

The above-described electrical characteristic tests are by no means complete. There are mechanical defects that do not leave trace on conventional test signals, or the electric power required to make the defects detectable is too high to the point that testing with such large electric signals is no longer "nondestructive".

Often on a production line, in attempt to eliminate the defective pieces that have escaped electric characteristic tests, ultrasonic microscopy is used in combination. In terms of on-the-line applicability, ultrasonic microscopy has some excellent characteristics. Namely, the system configuration is simple, defect signal has certain universality, and testing conditions are not required to be adjusted for individual capacitor. Nonetheless, again in terms of on-the-line applicability, ultrasonic microscopy has its own shortcomings. Due to diffusion in the air and reflection by the surface of the test object, ultrasonic microscopy requires a medium, normally water, for transmitting ultrasonic testing waves. Since the penetration depth of ultrasonic sound is limited, testing sensitivity to detect internal defects is affected by the size of the capacitor. It also requires relatively long measurement and mapping time. Finally, at the curved edge of capacitor, ultrasonic sound is mostly reflected and the volume around the edge is masked from detection.

Recognizing forementioned shortcomings, defect detection techniques using the principle of electromechanical resonance have been proposed as an alternative for ultrasonic microscopy (see, for example, U.S. Pat. No. 4,644,259, JP S61-108956 A, JP H07-174802 A, JP 2826422 B2, JP H11-219871 A, and "Non-destructive detection and localization of defects in multilayer ceramic chip capacitors using electromechanical resonances").

Electromechanical resonance is a phenomenon arising from coupling of electric signal to the mechanical vibration modes of a capacitor due to the inverse piezoelectric and piezoelectric effect. It is known that a geometrically simple structure having high symmetry such as a ceramic capacitor has multiple mechanical resonance frequencies (normal modes of vibration). When an oscillating electric field (voltage) is applied to a capacitor, mechanical vibration can be generated due to the inverse piezoelectric effect. When the frequency of the applied electric field approaches to one of the normal frequencies of the structure, the amplitude of the mechanical vibration increases. The amplified mechanical vibration in turn generates electric field due to the piezoelectric effect. The electric field generated by the mechanical vibration is observed as additional potential difference across the capacitor. This generation of electric signal due to resonance of mechanical oscillation is called electromechanical resonance.

U.S. Pat. No. 4,644,259, JP S61-108956 A, JP H07-174802 A, and JP 2826422 B2 teach applying electromechanical resonance as inspection methods for capacitor's internal defects. The basic implementation of the methods is such that the frequency of applied alternating voltage is changed in discrete steps while applying a high bias DC voltage (usually above the rated voltage) to a capacitor, and the capacitor's electrical reaction (reactance, impedance or ESR depending on the method) is measured at each frequency step. Since measurement is taken at each frequency step and it takes many frequency steps to map frequency response over an adequate span in frequency domain, these methods require a substantial amount of time to complete one inspection.

JP H11-219871 A is an inspection method that is using the same principle as forementioned ones but different in mechanism to generate the response voltage. In the proposal, it applies an alternating external stress, such as vibration due to ultrasonic wave, while the target capacitor is DC-biased. Electromechanical resonance in this case results in impedance change, and the resulting current change is used to identify defective capacitors.

However, since such proposal requires an external vibration source in addition to a DC bias voltage supply, it is not advantageous compared to the conventional ultrasonic microscopy which requires only the external vibration source.

As another technique using the principle of electromechanical resonance to identify defect in capacitors, studies on nonlinear acoustic effects of multilayer ceramic capacitors (MLCC) have been conducted by researchers at National Institute of Standards and Technology, NASA, University of Maryland et. al, and ir resulted in a series of papers. The goal of these studies is to distinguish a damaged capacitor with or without visible cracks. A tone burst signal which set at a pre-measured mechanical resonance frequency is used to excite the vibration mode through electromechanical coupling. When burst signal is terminated, the mode decays, and subsequent ring-down waveform is measured. It is claimed that thermal damage on capacitors can be identified from phase or frequency change of decaying mode over time.

Specifically, these studies employ following procedure for capacitor inspection.

a) Select a capacitor.
b) Apply DC bias to the capacitor. Apply a burst signal and update frequency of the signal in steps to determine the mechanical resonance frequency $f\alpha$ of the capacitor.
c) Under the same bias voltage environment, set frequency of the tone burst to the frequency $f\alpha$ determined in b) and apply to the capacitor.
d) Capture attenuation signal immediately after tone burst is terminated. A ring-down waveform (oscillation with decaying amplitude) will be generated. The ring-down mode initially oscillates at the frequency $f\alpha$, and as amplitude attenuates in time, frequency (or phase) of the oscillation changes.

The claim of the studies is such that the rate of change in frequency (or phase) in ring-down is different for a damaged capacitor from the healthy ones. Therefore, defective capacitors can be screened by measuring such changes.

When considering application onto a real production line, the inspection and screening method of the studies described above has numerous drawbacks.

For one, its sensitivity is low. With the advance of automated visual inspection technology, the highest demand for inspection is now against screening of internal defects. However, under the studies above, only capacitors with visible cracks can be reliably screened.

The measurement system used in the studies contain large systematic errors and low signal resolution. In L. Bechou, S. Meidi, Y. Ousten, and Y. Danto, "Non-destructive detection and localization of defects in multilayer ceramic chip capacitors using electromechanical resonances", Quality Rel. Eng. Int., vol. 12, pp. 43-53, 1996, FIG. 2, an attempt is made to map resonance spectrum of a capacitor by changing frequency of the tone burst signal stepwise and measuring response voltage. It only discovered one resonance peak, as against many that can be seen with a conventional electro-mechanical resonance measurement. (See FIG. 1A). It can be said that the measurement system of the above studies lacks sensitivity to distinguish different modes of oscillation.

The tact time, and thus the production speed, is critical for a mass-production line. The inspection method of the studies above requires determination of mechanical resonance frequency $f\alpha$ prior to the application of tone burst signal. This means for each inspection run, repetitive measurement and adjustment of testing parameters is necessary and thus requires more time. It is not possible to designate single value of $f\alpha$ for capacitors in the testing group because $f\alpha$ of each capacitor in the group varies, even if the group consists of capacitors with the same parts number and of the same lot, due to a slight difference in manufacturing conditions such as material composition and firing conditions. This is a major drawback of the method where high speed inspection is critical.

Furthermore, in the inspection method of the studies described above, common testing conditions for each capacitor in the testing group is not assured. For a healthy capacitor, mechanical resonance peaks generally have high Q values, hence, in the vicinity of a peak, voltage response of the capacitor greatly changes with a slight difference in frequency value. Therefore, since frequency of burst signal is set to one of the peak frequency values in the above method, a different capacitor could be tested with a very different energy condition.

It is known that a capacitor having internal defects may exhibit secondary resonance modes in addition to normal vibration modes as shown in FIG. 1B. In the above-described study method, ring-down is modeled with decay of purely a single mode. Since the method does not account for the contribution of secondary modes, these modes are left undetected.

Finally, expensive, and large-scale devices including phase-sensitive receiver and active diplexer are necessary to implement the inspection method of the studies described above. The system configuration may be too complex to be applied on a real production line.

Therefore, all of the proposed alternatives for ultrasonic microscopy which are forth described are not suitable for use in production line from the viewpoints of measurement sensitivity, inspection speed, uniformity in testing conditions, and simplicity of the system configuration.

SUMMARY OF INVENTION

The present invention has been motivated by the above-described conventional circumstances and shortcomings. The first objective of the present invention is to provide a nondestructive inspection method for capacitors and dielectric electronic components which is: suitable to be applied on a production line: precluding the use of voltage or current that exceeds the rating; applying common inspection conditions to each testing component; and fast and reliable in detecting internal defects. The second objective of the present invention is to provide an inspection apparatus to implement the inspection method.

Solution to Problem

The capacitor inspection method of the present invention is characterized by the following.

First, to each capacitor in the testing group, the capacitor inspection method imposes: a step of applying a DC bias voltage whose value is equal to or lower than the rated voltage of the capacitor; and a vibration response voltage generating step (VRVG step) of inputting an electric signal whose frequency continuously changes with time to the capacitor, causing mechanical vibration in the capacitor and generating vibration response voltage from the capacitor, and outputting superposition of the DC bias voltage and the vibration response voltage as reaction voltage.

Second, it is preferable that in the VRVG step of the first invention, the electric signal is continuously modulated from a first frequency to a second frequency, and at least one frequency of normal modes of vibration for the testing group, which are identified prior to inspection from the measurements of one or more capacitors of the same type as those in the testing group, is contained in the range of frequency modulation.

Third, it is preferable that for the capacitor inspection method of the first invention or the second invention, for the input electric signal in the VRVG step the speed of frequency modulation is not varied with capacitor and common for the capacitors in the testing group. The speed of frequency modulation is set based on certain transition speeds, and a transition speed is determined by a time constant found from the waveforms of capacitors of the same type as those in the testing group measured in the decay or ramp-up of a normal mode of vibration contained in the expected range of frequency modulation, or by trial-and-errors of observing transient response in vibration response voltage in capacitors of the same type as those in the testing group with varied frequency modulation speed.

Fourth, it is preferable that in the capacitor inspection method according to the first to the third inventions, in the VRVG step, frequency of the input electric signal is modulated faster than the transition speed, the vibration generated in the capacitor contains transient vibration, and the vibration response voltage contains transient response.

Fifth, it is preferable that in the capacitor inspection method according to the first to the fourth inventions, the time parameter of the set frequency modulation in the VRVG step is matched to the time of a measured vibration response voltage to obtain voltage response as a function of frequency or a resonance curve.

Sixth, it is preferable that in the capacitor inspection method according to the first to the fifth inventions, in the VRVG step, frequency of the electric signal applied to the capacitor is continuously modulated, and when a value of the vibration response voltage or the reaction voltage reaches a predetermined threshold, the frequency of the electric signal is switched to the other frequency which is different from the instantaneous frequency of the modulation at the time of the switching, generating transient mechanical vibration in the capacitor and causing transient response in the vibration response voltage of the capacitor.

Seventh, it is preferable that the capacitor inspection method according to the first to the sixth inventions further imposes: a vibration response voltage measurement step (VRVM step) of identifying and measuring the vibration response voltage from the reaction voltage: and a quality determination step of determining quality of the capacitor by comparing features of the waveform of vibration response voltage measured in the VRVM step against those that are measured previously from non-defective capacitors.

Eighth, it is preferable that in the capacitor inspection method according to the seventh invention, on the transient response portion of the waveform of vibration response voltage, self-mixing of frequencies is performed by squaring the values of said transient response portion of the waveform and the quality of the capacitor is determined based on the low frequency band spectrum of the squared waveform.

Ninth, it is preferable that in the capacitor inspection method according to the seventh invention or the eighth invention, in the VRVM step, the DC bias voltage is removed from the reaction voltage and the vibration response voltage is singled out by a filtering process.

Tenth, the capacitor inspection apparatus according to the present invention includes:
a holder portion to place an inspecting capacitor;
power supply devices including a bias voltage supply and a waveform generator which are connected to the input side of the holder portion;
a constant current circuit that is connected in series between the holder portion and the waveform generator; and
a filter circuit that is connected in parallel to the holder portion,
wherein the roles and functions of each component of the apparatus are that: the bias voltage supply applies a DC bias voltage to a capacitor; the waveform generator, to a capacitor, inputs an electric signal whose frequency is continuously modulated from a first frequency to a second frequency or inputs a signal whose frequency is continuously modulated and then switched to the other frequency that makes a discrete jump from the instantaneous frequency of modulation at the time of the switching triggered by the vibration response voltage from the capacitor reaching the predetermined threshold; the constant current circuit stabilizes the input electric signal and the output reaction voltage; and the filter circuit singles out a vibration response voltage by removing the DC bias voltage from the reaction voltage.

Eleventh, it is preferable that in the capacitor inspection apparatus according to the tenth invention, the constant current circuit is consist of a resistor and/or an inductor.

Twelfth, it is preferable that in the capacitor inspection apparatus according to the tenth invention or the eleventh invention, the filter circuit is an RC high-pass filter circuit made of capacitors and resistors.

Advantageous Effects of Invention

The capacitor inspection method according to the present invention can be classified as an ultrasonic flaw detection technique using the effect of electromechanical resonance as the vibration source that requires no external vibration source. The detects are detected by obtaining information on resonance characteristics of the capacitor from voltage response to vibration due to the piezoelectric effect or from transient response due to an abrupt change in vibration frequency. Since the electromechanical resonance effect generates vibration within the capacitor, the inspection method of the present invention is free of the problems of reflection and diffusion of the ultrasonic wave that have haunted the conventional ultrasonic microscopy. The inspection method of present invention requires no outside medium for transmitting the vibration, and the inspection sensitivity is not limited by the size of the capacitor.

In the inspection method of the present invention, each inspection run is performed with a set of predefined parameters, and repetitive measurements are not required. Therefore, each inspection run can be completed in extremely short time in principle, in an order of milliseconds to sub-milliseconds.

Furthermore, in the inspection method of the present invention, inspection parameters used for inspection are common for all capacitors in the testing group (i.e., the group consist of capacitors of the same type, having the same part number, or produced in the same lot). A priori measurement of physical characteristics, such as mechanical resonance frequency, of individual capacitors and adjustments of inspection parameters in response to the variation in the physical characteristics are not conducted. Hence, the inspection method precludes uncertainty due to variation of physical characteristics of capacitors in the testing group, and reliability and reproducibility of inspection result is assured by the standardized testing conditions.

The inspection method of the present invention has high frequency resolution that enables to identify a slight signature of defect from the resonance characteristics or from transient response. The inspection method of the present invention has wide frequency bandwidth, they can selectively measure either resonance curve or transient response from mechanical vibration modes over a wide range of frequency.

Finally, the inspection method of the present invention is easy to employ, and the inspection apparatus is composed of affordable and commercially available devices. The entire inspection system can be installed at a low cost and in a small space.

Therefore, the capacitor inspection method and capacitor inspection apparatus of the present invention has the capability and desired characteristics for inspecting defects of a capacitor on a production line.

BRIEF DESCRIPTION OF DRAWINGS

FIG. 1A shows the resonance curve and normal vibration modes of a non-defective capacitor.

FIG. 1B shows the resonance curve and secondary modes due to defects in the defective capacitor.

FIG. 9A shows a reference waveform of vibration response voltage if switching is not performed.

FIG. 9B shows a measured waveform of vibration response voltage with switching. The input electric signal is switched to a sinusoidal wave of $f_{switch}$=1300 kHz as vibration response voltage reaches Vthresh=0.05 V.

FIG. 9C is an enlarged view of the transient response in the waveform.

FIG. 10A shows a waveform of vibration response voltage generated by the frequency modulation signal.

FIG. 10B is an enlarged view of the transient response in the waveform.

FIG. 10C shows a frequency characteristic curve constructed from the waveform and the frequency control function.

FIGS. 11A-1 to 11C-2 show identification of defective capacitors with the inspection mode (1).

FIG. 11A-1 shows the frequency characteristic curve of Non-Defective Capacitor 1.

FIG. 11A-2 shows transient response of Non-Defective Capacitor 1.

FIG. 11B-1 shows the frequency characteristic curve of Defective Capacitor 1.

FIG. 11B-2 shows transient response of Defective Capacitor 1.

FIG. 11C-1 shows the frequency characteristic curve of Defective Capacitor 2.

FIG. 11C-2 shows transient response of Defective Capacitor 2.

FIGS. 14A to 14B represent a measurement of non-defective capacitor with the inspection mode (2). A frequency modulation signal with $f_i$=500 kHz, $f_t$=2500 kHz, and T=16 ms is applied.

FIG. 14A shows the waveform of vibration response voltage.

FIG. 14B is a resonance curve constructed from the waveform and the frequency control function.

FIGS. 15A-1 to 15C-2 are the comparison of resonance curves constructed with the inspection mode (2) between non-defective and defective capacitors. A resonance curve measured with the conventional electromechanical resonance technique is added as reference.

FIGS. 16A-1 to 16D-2 show identification of defective capacitors with the inspection mode (3).

FIG. 16A-1 shows transient response of Non-Defective Capacitor 1.

FIG. 16A-2 is the low-frequency band spectrum from the squared values of the transient response of Non-Defective Capacitor 1.

FIG. 16B-1 shows transient response of the Non-Defective Capacitor 2.

FIG. 16B-2 is the low-frequency band spectrum from the squared values of the transient response of Non-Defective Capacitor 2.

FIG. 16C-1 shows transient response of Defective Capacitor 1.

FIG. 16C-2 is the low-frequency band spectrum from the squared values of the transient response of Defective Capacitor 1.

FIG. 16D-1 shows transient response of Defective Capacitor 2.

FIG. 16D-2 shows is the low-frequency band spectrum from the squared values of the transient response of Defective Capacitor 2.

DESCRIPTION OF EMBODIMENTS

Figure 1A:
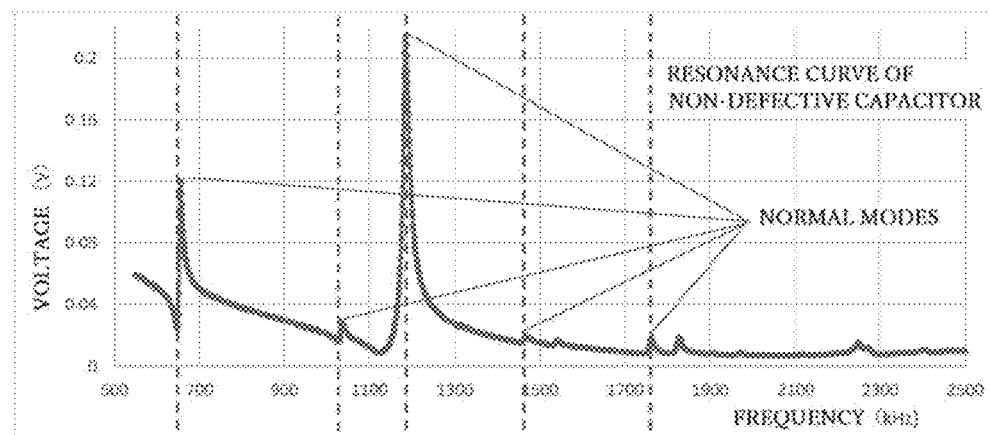
FIGS. 1A to 1B show a comparison between a resonance curve of a non-defective capacitor and a resonance curve of a defective capacitor.
Figure 1B:
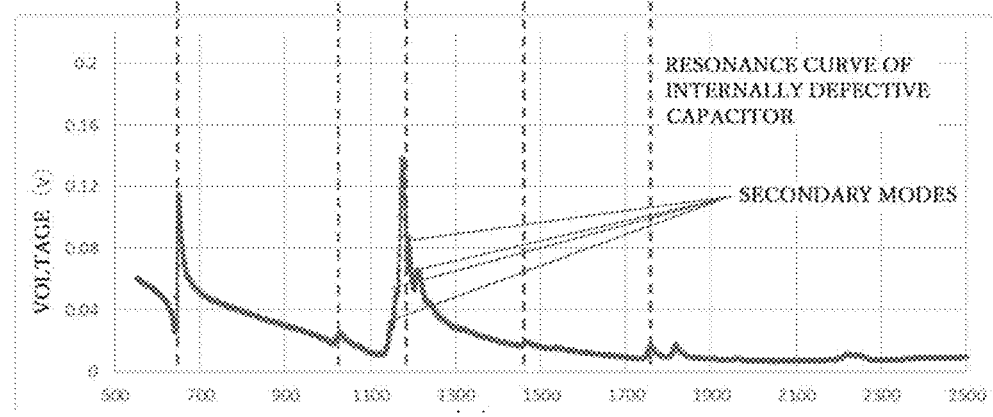

The capacitor inspection method of the present invention include a step of applying a DC bias voltage onto the capacitor being inspected whose value is equal to or lower than the rated voltage of the capacitor; and a vibration response voltage generating step (VRVG step) of inputting an electric signal whose frequency continuously changes with time to the capacitor, causing mechanical vibration in the capacitor and generating vibration response voltage from the capacitor, and outputting superposition of the DC bias voltage and the vibration response voltage as reaction voltage.

(Inspection Target Capacitor)

For the inspection method of the present invention, there is no notable limitation for capacitors that can be subject for testing, as long as they are made of dielectric materials. Types of capacitors that can be tested include a multilayer ceramic capacitor, a disk-shaped ceramic capacitor, a film capacitor, and an electrolytic capacitor. The inspection method of the present invention is especially suitable for inspection of a multilayer ceramic capacitors made of ferroelectric material such as barium titanate.

The inspection method of the present invention, is applied to a group of capacitors with similar mechanical characteristics, that is, the group comprised of capacitors of a same type, having the same part number, or manufactured in the same lot.

<DC Bias Voltage Applying Step>

In the capacitor inspection method of the present invention, the first step is to apply DC bias voltage onto a capacitor subject for inspection.

Modern ceramic capacitors, in order to accomplish compactness and high capacitance, employ ferroelectric material such as barium titrate. Although barium titrate itself is ferroelectric and has built in polarization, barium titrate crystals orients in random directions in a capacitor, and they sum up to only a small built-in polarization for a capacitor, which usually does not become eminent under an AC-field environment.

With a DC bias voltage applied, the crystals can be partially aligned, and piezoelectric material within the capacitor can be polarized, which greatly enhances inverse piezoelectric effect for the capacitor.

The DC bias voltage is required to be sufficiently constant while inspection and measurements are taking place, but it is not required to be constant at other times. For example, a rectangular wave having a period of twice or more the inspection time, a sinusoidal wave having a period which is sufficiently longer than the inspection time, or the like may be used.

The value of bias voltage, in the DC bias voltage applying step, is equal to or lower than the rated voltage of the capacitors.

When an electric signal is input to a capacitor while a bias voltage has been applied, it generates electric field within the capacitor due to the inverse piezoelectric effect. The generated electric field has differentials at the electrode boundaries of the capacitor, which acts as a stress from electromechanical coupling. The alternating stress generates vibrations which propagate through the structure of the capacitor. Thus, the input electric signal, with applied DC bias voltage, acts as a vibrations source for the capacitor.

Due to the alternating stress exerted at a constant frequency, the capacitor dissipates excess energy in a form of heat or stores the energy in a form of structural vibration, and, after a certain period of time, it reaches an equilibrium stable.

The stable vibration state is referred to as steady state, and the state has one-to-one correspondence with the frequency of the exerted stress, that is, the frequency of the input signal.

A geometrically simple structure such as a capacitor has multiple modes of mechanical resonances. When the frequency of the exerted stress matches one of the resonance frequencies (normal modes of vibration), vibration amplitude increases. On a mechanical resonance curve, each normal mode of vibration is observed as a localized peak at a frequency (a normal frequency of vibration, or a normal vibration mode).

The vibration generated in the capacitor by an electric signal is converted into voltage by the piezoelectric effect. The capacitor under a DC bias and acted by an electric signal, then, will output a voltage that is a superposition of the voltage generated by vibration due to piezoelectric effect and the input electric signal. In the present invention, this superimposed voltage is referred to as vibration response voltage.

Therefore, at a steady vibration state of a given frequency, the vibration response voltage of a capacitor indicates the tendency of the capacitor to vibrate at that frequency, that is, the mechanical resonance characteristic of the capacitor.

In the following descriptions, a resonance curve means values of vibration response voltage generated by sinusoidal waves of a fixed amplitude from a capacitor under DC bias and measured at steady state conditions.

For a capacitor vibrating in a steady state with frequency A (and with the input signal of frequency A), if the input signal is rapidly or instantaneously changed to frequency B, the vibration of the capacitor will eventually converge to frequency B, and the capacitor will vibrate in a steady state of frequency B. However, in the intermediate state, a transient response due to stored energy in the mechanical vibration modes occurs. The vibration of the capacitor in the intermediate state is a mixture of a steady state vibration of frequency B and the mechanical vibration modes which are coupled to the frequencies in the range between frequency A and frequency B.

Therefore, transient vibration contains information on the vibration modes of the structure for a range of frequencies.

In the same manner to the steady state vibration, the transient vibration of the capacitor is also converted into a voltage by the piezoelectric effect, and it is electrically output as a part of the vibration response voltage. In the present invention, a portion of a waveform of vibration response voltage that corresponds to transient vibration is referred to as transient response.

<Vibration Response Voltage Generating Step (VRVG Step)>

In the conventional inspection method using the electromechanical resonance, the frequency of the input electric signal is changed in discrete steps, and the capacitor's response in a steady state is measured at each frequency to construct a resonance curve in frequency domain.

Contrary to the conventional methods, in the capacitor inspection method of the present invention, frequency of the input electric signal is continuously changed with a frequency control function to vibrate a capacitor. The generated vibration is converted into voltage with the piezoelectric effect, and combined with the input electric signal, is output as the vibration response voltage.

Further, in the capacitor inspection method of the present invention, by choosing a suitable speed of the frequency modulation of the input signal, or by creating a discrete jump in the input frequency by switching to another signal after a modulation signal is input for a certain period of time, the vibration response voltage output from the capacitor can selectively be encoded with the information of: frequency characteristics, values of the resonance curve, mechanical vibration modes in its transient response, or the combinations thereof.

(Inspection Method and Principles Thereof)

The capacitor inspection method of the present invention can take 3 modes: the mode (1) in which frequency of the input electric signal is modulated at a speed higher than the required value, frequency characteristic of the capacitor is mapped onto the vibration response voltage in a short period of time, and transient response is generated from the mechanical vibration modes in the range of the frequency modulation; the inspection mode (2) in which frequency of the input electric signal is modulated at a speed lower than the required value, and values of the resonance curve of the capacitor is mapped onto the vibration response voltage; and the inspection mode (3) in which a threshold voltage of choice is set for the vibration response voltage, the capacitor is vibrated with the input of a frequency modulation signal for a certain period of time, the input signal is switched to make a discrete jump in frequency when vibration response voltage reaches the threshold voltage, and transient response is output from the capacitor.

First, the basic principles of the inspection mode (1) and mode (2) are described.

In the mode (1) and mode (2), an input electric signal is continuously modulated from a first frequency ($f_i$) to a second frequency ($f_t$). The frequency range from $f_i$ to $f_t$ is chosen in a manner that at least one frequency of the capacitor's normal modes of vibration ($f_0$) is contained in the range. It is also allowed that the frequency range contains multiple modes of vibration.

Without loss of generality, in the discussion below it is assumed that at some time $t=t_a$, the instantaneous frequency $f_a$ of the input frequency modulation signal coincides with one of the normal vibration frequencies $f_0$ of the capacitor.

(Principles of the Inspection Mode (1): Transient Response and Frequency Characteristic)

The principle of the inspection mode (1) is to modulate frequency of the input signal at a speed higher than the required value and generate transient response from the capacitor.

The speed of modulation that is required for transient response generation is quantified below.

During frequency modulation, when the frequency of the input signal reaches one of the capacitor's normal modes of vibration at $t=t_a$, the capacitor is vibrating with the normal vibration frequency $f_0=f_a$. The vibration builds up and kinetic energy is stored in the capacitor. As time elapses, the frequency of the input signal changes and reaches another instantaneous frequency $f_b$ at $t=t_b=t_a+\Delta t$ in a period of $\Delta t$. In response to the change in the frequency of the input signal and hence of the exerted stress, the vibration tends to the steady state vibration of $f_b$, and the amplitude of the vibration response voltage tries to reach the value of resonance curve at $f_b$ in attenuation. However, values of a resonance curve in the vicinity of a peak rapidly changes. If the fractional change in the values of the resonance curve between $f_0$ and $f_b$ exceeds the maximum attenuation rate $\text{Exp}(-\Delta t/\tau_m)$ given by a free decay of the normal vibration mode, the vibration response voltage cannot attenuate to the value of the resonance curve at the frequency $f_b$ in the time length $\Delta t$. In such a case, the remnant mechanical vibration of the normal mode due to inertia will interfere with the stress exerted by the input electric signal, and it presents itself as transient response in the vibration response voltage.

Figure 2:
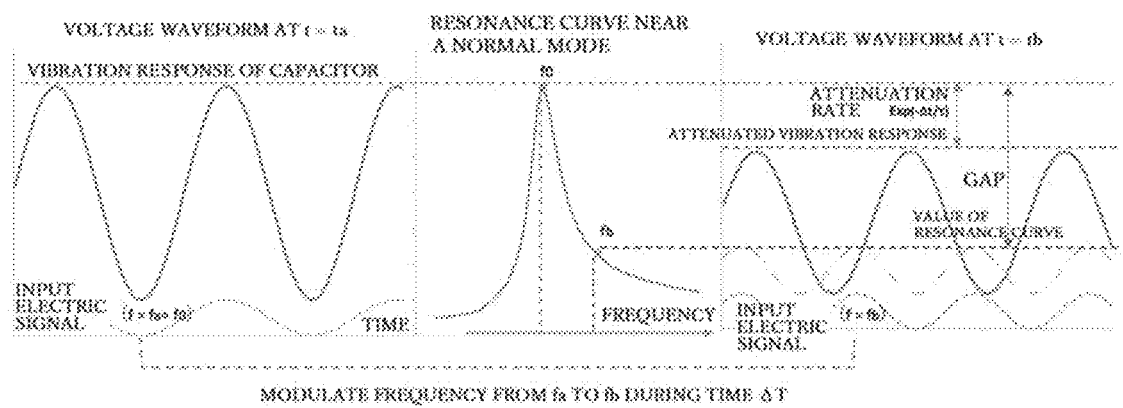
FIG. 2 is a conceptual diagram showing a case where a vibration response voltage of a capacitor cannot keep up with the modulation speed of an input electric signal.

FIG. 2 is a conceptual diagram showing such a case where the frequency modulation speed of an electric signal is high, and the amplitude of vibration response voltage do not follow the value of the resonance curve.

Therefore, by setting the speed of frequency modulation from $f_i$ to $f_t$ to be greater (faster) than the required value, referencing to sharpness of the peak of a normal vibration mode and the decay time $T_m$ of the normal vibration mode, vibration response voltage can be encoded with the information on the normal vibration mode as a transient response near $f_a$ due to the remnant vibration of the normal vibration mode.

For an input frequency modulation signal whose frequency is modulated from $f_i$ to $f$ by a frequency control function, if the time parameter of the frequency control function is matched to the time of the measured vibration response voltage, a parametric equation can be obtained that relates vibration response voltage to frequency. The amplitude of the vibration response voltage represents frequency characteristics of the capacitor to a given modulation signal. The frequency characteristic obtained here is different from the resonance curve since measurements are not taken in the steady state, but it has properties similar to that of the resonance curve such as peak value and peak frequency and is useful in identifying a defective capacitor.

(Inspection Mode (2): High Precision Measurement of Resonance Curve)

Next, the principles for the mode (2) will be described. In the mode (2), frequency of the input signal is modulated at a low speed and the amplitude of vibration response voltage traces the resonance curve.

In this mode, the frequency of the input electric signal is modulated from the first frequency $f_i$ to the second frequency $f_t$ at a speed lower than the required value. The amplitude of vibration response voltage from the capacitor converges to a value of the resonance curve in pseudo-steady state. That is, when frequency of the input electric signal changes from the frequency $f_a$ to the frequency $f_b$, and if the fractional change in the values of the resonance curve between $f_a$ and $f_b$ is lower than the maximum attenuation rate $\text{Exp}(-\Delta t/\tau_m)$ given by a free decay of the normal vibration mode, the vibration response voltage has enough time to converge to the steady state value at $f_b$.

In this case, no interference occurs between the electric signal and the remnant mechanical vibration of the normal mode, and the amplitude of vibration response voltage traces the resonance curve of the capacitor.

Figure 3:
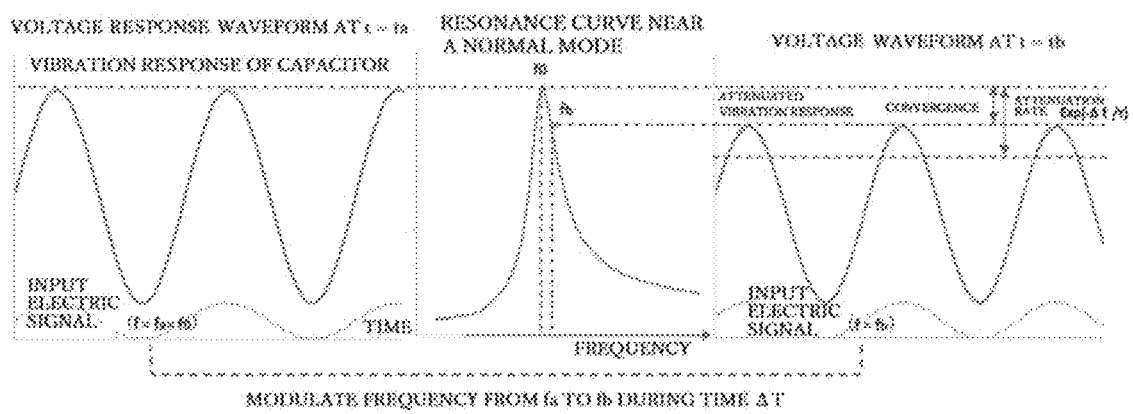
FIG. 3 is a conceptual diagram showing a case where a vibration response voltage of a capacitor can keep up with the modulation speed of an input electric signal.

FIG. 3 is a conceptual diagram showing a case where frequency modulation speed of the electric signal is low, and the amplitude of vibration response voltage traces the resonance curve of the capacitor.

In the inspection mode (2), by setting the speed of frequency modulation from $f_i$ to $f_t$ to be smaller (slower) than the required value, referencing to sharpness of the peak of a normal vibration mode and the decay time $T_m$ of the normal vibration mode, the amplitude of vibration response voltage follows the resonance curve. If the time parameter of the frequency control function is matched to the time of the measured vibration response voltage, a parametric equation that relates vibration response voltage to frequency can be obtained. The amplitude of the vibration response voltage as a function of frequency represents the resonance curve of the capacitor.

(Transition Speed of Modulation and the Applicable Condition of the Inspection Mode (1) or Mode (2))

The transition speed of frequency modulation above which a vibration response voltage contains transient response (or below which it does not contain the response) is described more quantitatively below.

(Waveform of Frequency Modulation Signal and Frequency Control Function)

First, the waveform of an input frequency modulation signal and frequency control function for frequency modulation are defined.

The waveform of an input signal whose frequency changes with time can be expressed in the general form as Equation 1. A is the amplitude of oscillation and φ(t) is a time varying phase function.

[Math 1]

$$W(t) = A \cdot \text{Sin}(\varphi(t)) \qquad \text{<Equation 1>}$$

When the reference time of the waveform is set at $t=t_i$, and the phase of that time is $\varphi_i$, the phase function can be expressed as the form in Equation 2.

[Math 2]

$$\varphi(t) = \varphi_i + 2\pi \int_{t_i}^{t} h(s)\, ds \qquad \text{<Equation 2>}$$

The instantaneous frequency $f_r$ of the waveform at time $t=t_r$ is give by the following Equation 3 as a time differential of the phase function.

[Math 3]

$$f_r = \frac{1}{2\pi} \frac{d\phi}{dt}\bigg|_{t=t_r} = h(t_r)$$ <Equation 3>

In the present invention, h(t) is referred to as frequency control function.

Regarding the reference time $t=t_i$ to be the start time of frequency modulation, the frequency of an input signal is modulated from $f_i$. Then the frequency control function can be defined by the following Equation 4.

[Math 4]

$$h(t)=f_i+g(t)$$ <Equation 4>

Here, $g(t_i)=0$. In the input electric signal of the present invention, $f_i$ is the said first frequency of frequency modulation, and $f_r=f_i+g(t_r)$ at the modulation end time $t=t_r$ is the said second frequency.

In a particular case, when modulation of frequency is linear, the frequency control function is in the form of Equation 5,

[Math 5]

$$h(t)=f_i+\alpha\cdot(t-t_i)$$ <Equation 5> where the constant $\alpha$ represents a time rate of change of frequency.

Figure 4:
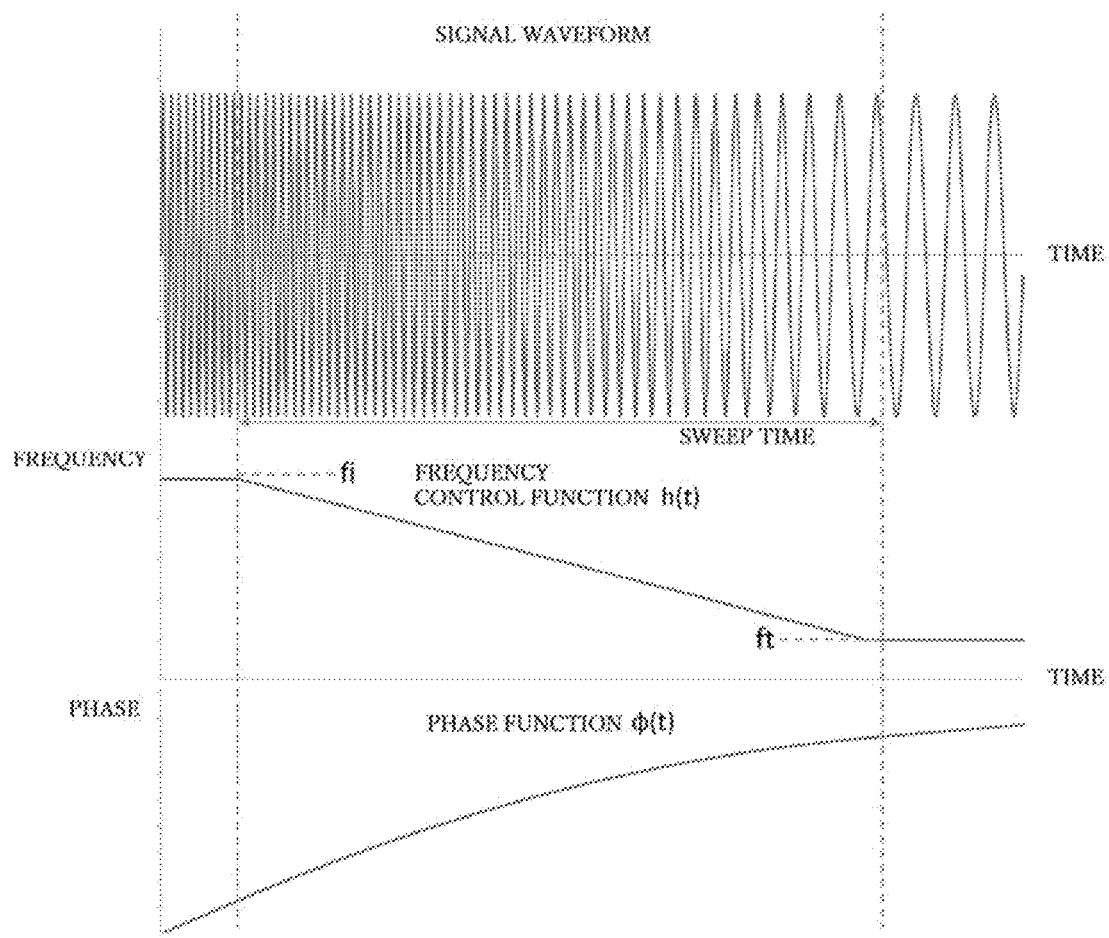
FIG. 4 is an example of a frequency modulation signal, and shows its waveform, the frequency control function, and the phase function.

FIG. 4 shows an example of the signal waveform whose frequency is modulated in time with the frequency control function h(t) and the corresponding phase function φ(t).

(Sharpness of Peak and Time Constant)

For the resonance curve representing the vibration output (power) of a vibrating system, the sharpness of the peak of a normal vibration mode is represented by a Q value. A Q value is an indicator of the prominence of the mode. It is defined from the bandwidth of a resonance peak of a normal vibration mode as in Equation 6.

[Math 6]

$$Q_B = \frac{f_0}{\Delta f}$$ <Equation 6>

Here, $f_0$ is the frequency of the normal mode of vibration, and $\Delta f$ is the width of the frequency band over which the vibration output (power) attenuates by half, referred to as full width at half maximum. In addition, when the symmetry of the peaks is high around the normal frequency $f_0$, the Q value can be expressed by the following Equation 7 using the half width at half maximum $\Delta f_{1/2}$.

[Math 7]

$$Q_B = \frac{f_0}{2\Delta f_{1/2}}$$ <Equation 7>

Figure 5:
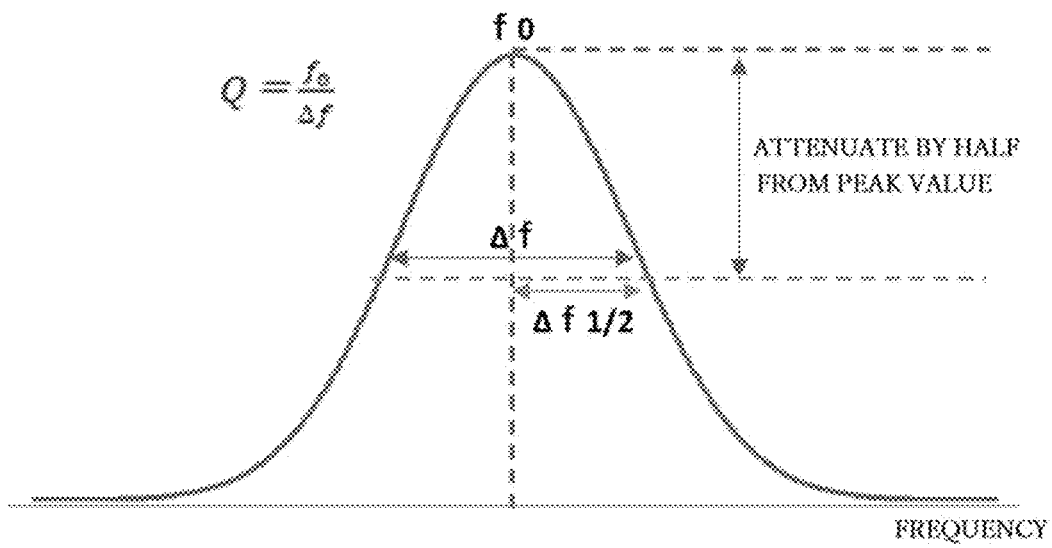
FIG. 5 is a schematic of a resonance curve of a certain vibration mode, and relations between the normal frequency, full width at half maximum, and half width at half maximum are shown.

FIG. 5 shows a relation between the normal frequency $f_0$, the full width at half maximum, and the half width at half maximum of a resonance peak.

In addition, the Q value can also be defined as a ratio of the stored energy of the vibration system to the energy lost per each vibration cycle when the vibration system is freely vibrated in a normal vibration mode. This definition of Q is related to the time constant τ of a decay envelope of the normal vibration mode by the following Equation 8.

[Math 8]

$$Q_D=\pi\tau f_0$$ <Equation 8>

The higher the time constant (i.e., the Q value) is, the lower the rate at which vibration of the mode is attenuated in a given period of time, and it takes longer time for the mechanical vibration of the normal mode to be subdued. Thus, for a normal mode having a high Q value, the vibration response voltage is less likely to follow the value of the resonance curve under a frequency modulating input signal, and transient response is output in the vibration response voltage.

For a system having a high Q value, such as a non-defective capacitor, two definitions of Q are equivalent, and $Q_B=Q_D$ is valid. When $Q_D$ (Equation 8) is substituted for $Q_B$ in Equation 7, and the equation is solved for $\Delta f_{1/2}$ (half width at half maximum), the following Equation 9 is obtained.

[Math 9]

$$\Delta f_{1/2} = \frac{1}{2\pi\tau}$$ <Equation 9>

It means that the fractional change in frequency until the output (power) of the vibration mode is attenuated into a half of the original value is given by reciprocal of the time constant τ of a free mode decay.

(The Transition Speed of Frequency Modulation and the Application Condition for Each Inspection Mode)

The frequency modulation speed is controlled with the frequency control function of Equation 4, and the half-power time $\Delta t_{1/2}$, during which the modulated signal is changed by $\Delta f_{1/2}$ from the value $f=f_a=f_0$ at $t=t_a$, is given in the following Equation 10.

[Math 10]

$$f_0=f_i+g(t_a)$$

$$f_0+\Delta f_{1/2}=f_i+g(t_a+\Delta t_{1/2})$$

[Math 11]

$$\Delta f_{1/2}=|g(t_a+\Delta t_{1/2})-g(t_a)|$$ <Equation 10>

An absolute value is taken on the right side of Equation 10, since $\Delta f_{1/2}$ is defined as a positive value, Equation 10 is applicable to both the case of modulating from a higher frequency to a lower frequency ($f_a=f_0>f_0$) and the case of modulating from a lower to a higher frequency ($f_a=f_0<f_r$).

In a case of modulating from a lower frequency to a higher frequency, Equation 10 can be solved for the half-power time $\Delta t_{1/2}$, obtaining Equation 11.

[Math 12]

$$\Delta t_{1/2}=g^{-1}(\Delta f_{1/2}+g(t_a))-t_a$$ <Equation 11>

Here $g^{-1}$ is the inverse function of g. The value of $\Delta f_{1/2}$ from Equation 9 may be substituted into Equation 11 to be used as an indicator of the frequency modulation speed. However, Equation 11 is complex and not very useful as an indicator.

In the inspection mode (1) and mode (2), it is not likely to impose a rapid change in the rate of frequency modulation. Then, g(t) in Equation 10 can be expanded in a Taylor series at $t=t_a$ to find a first order approximation equation of for $\Delta f_{1/2}$.

[Math 13]

$$\Delta f_{1/2} \cong \left|\frac{dg(t)}{dt}\right|_{t=t_a} \Delta t_{1/2} \qquad \text{<Equation 12>}$$

Solving Equation 12 for $\Delta t_{1/2}$, Equation 13 is obtained.

[Math 14]

$$\Delta t_{1/2} = \Delta f_{1/2}(|g'(t_a)|)^{-1} \qquad \text{<Equation 13>}$$

Here, g' is the first time derivative of g, and it represents the rate (or the speed) of frequency modulation.

When the value of $\Delta f_{1/2}$ from Equation 9 is substituted into Equation 13, the half-power time $\Delta t_{1/2}$ is expressed in terms of the decay time constant $\tau$ and the rate of frequency modulation as in the following Equation 14.

[Math 15]

$$\Delta t_{1/2} = (2\pi |g'(t_a)|\tau)^{-1} \qquad \text{<Equation 14>}$$

In a particular case of linear frequency modulation, as in Equation 5, by substituting the value of $\Delta f_{1/2}$ from Equation 9 into the solution of Equation 10, the half-power decay time $\Delta t_{1/2}$ is expressed in terms of the decay time constant $\tau$ and the constant frequency modulation rate $\alpha$ as in the following Equation 15.

[Math 16]

$$\Delta t_{1/2} = (2\pi |\alpha|\tau)^{-1} \qquad \text{<Equation 15>}$$

During half-power time $\Delta t_{1/2}$ given in Equation 14 or Equation 15 (or Equation 11), the power output of the resonance vibration is reduced by a factor of one half while the frequency of the modulation signal changes by $\Delta f_{1/2}$. In terms of the vibration response voltage, since the power is proportional to the square of the amplitude, it corresponds to a state in which the amplitude of the vibration response voltage decays into $1/\sqrt{2}$ of the peak value.

For a decay envelope of the normal vibration mode that is decaying with the time constant $\tau$, the decay time $\Delta t_{decay}$, required for the amplitude to attenuate into $1/\sqrt{2}$ of its peak value can be obtained by the following.

[Math 17]

$$\text{Exp}\left(-\frac{\Delta t_{decay}}{\tau}\right) = \frac{1}{\sqrt{2}} \qquad \text{<Equation 16>}$$

$$\Delta t_{decay} = \frac{1}{2}\ln(2)\tau$$

If the half-power time $\Delta t_{1/2}$, which is expressed in terms of the frequency modulation rate and the time constant $\tau$ in Equation 14, is greater than the decay time $\Delta t_{decay}$ of the free-decay envelope of the normal vibration mode, which is given in Equation 16 in terms of the time constant $\tau$, the vibration response voltage has enough time to settle into steady-states, and the amplitude of the voltage traces the resonance curve.

Therefore, by combining Equation 14 and Equation 16 with a condition $\Delta t_{decay} < \Delta t_{1/2}$, the application condition of the inspection mode (2) is given as the inequality in terms of the time constant $\tau$ and the rate of frequency modulation.

[Math 18]

Application condition of inspection mode (2): $|g'(t_a)|$
$$|<(\pi \ln(2)\tau^2)^{-1} \qquad \text{<Equation 17>}$$

Similarly, if the half-power time $\Delta t_{1/2}$ is smaller than (or equal to) the time $t_{decay}$ of the free-decay envelope of the normal vibration mode, vibration of the normal mode cannot keep up with the speed of frequency modulation, and it results in transient response in the vibration response voltage.

Therefore, by combining Equation 14 and Equation 16 with a condition $\Delta t_{decay} \geq \Delta t_{1/2}$, the application condition of the inspection mode (1) is given as the inequality in Equation 18.

[Math 19]

Application condition of inspection mode (1): $|g'(t_a)|$
$$|\geq(\pi \ln(2)\tau^2)^{-1} \qquad \text{<Equation 18>}$$

The right-hand side of Equation 17 or Equation 18 is identified as the transition speed of frequency modulation. (Linear Modulation of Frequency)

As a more specific case, linear modulation of the frequency of the input electric signal is considered. The linear frequency modulation signal is a modulation scheme in which the frequency control function is given in the form of Equation 5, and it is widely used because of its simplicity.

The application conditions for the inspection mode (2) and mode (1) are obtained by combining Equation 15 and Equation 16, under the conditions either $\Delta t_{decay} < \Delta t_{1/2}$ or $\Delta t_{decay} \geq \Delta t_{1/2}$, respectively.

[Math 20]

Application condition of inspection mode (2): $|\alpha|<(\pi \ln(2)\tau^2)^{-1}$ <Equation 19>

[Math 21]

Application condition of inspection mode (1): $|\alpha|\geq(\pi \ln(2)\tau^2)^{-1}$ <Equation 20>

The right-hand side of Equation 17 or Equation 18 is the transition speed of frequency modulation for a linear frequency modulation.

A linear frequency modulation signal is generally expressed in terms of a modulation start frequency $f_i$ (first frequency of the electric signal), a modulation terminal frequency $f_t$ (second frequency of the electric signal), and a total time length of modulation T. In this notation, frequency modulation speed $\alpha$ for $f_t > f_i$ is given by the following Equation 21.

[Math 22]

$$\alpha = \frac{f_t - f_i}{T} \qquad \text{<Equation 21>}$$

When the value of $\alpha$ in Equation 19 or in Equation 20 is substituted with Equation 21 and the equations are solved for T, the following equations for the application conditions in terms of T are obtained.

[Math 23]

Application condition of inspection mode (2): $T > |f_t - f_i|\pi \ln(2)\tau^2$ <Equation 22>

[Math 24]

Application condition of inspection mode (1): $T \leq |f_t - f_i| \pi \ln(2) \tau^2$ <Equation 23>

(Verification of the Application Condition for the Mode (1) and Mode (2))

In the verification, the start frequency $f_i$ and the terminal frequency $f_t$ are set to fixed values while the total time length of modulation T is varied. The transition speed condition in Equation 19 and in Equation 20 corresponds to the modulation time condition in Equation 22 and Equation 23, respectively. The appearance of transient response in the vibration response voltage signals the applicability of the inspection mode (1), whereas the non-appearance signals the applicability of the inspection mode (2).

(Determining the Value of Time Constant $\tau$)

The time constant is obtained from a free decay envelope of the normal vibration mode at 1200 kHz band. The normal vibration mode is excited with an input sinusoidal wave of 1190 kHz, and the input signal is terminated after the vibration response voltage has settled into a steady state. The subsequent free decay of the normal vibration mode is measured.

Figure 6:
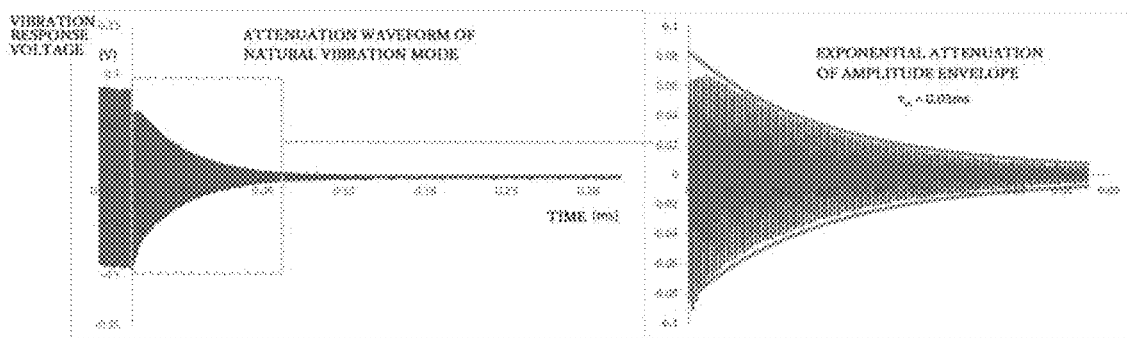
FIG. 6 shows decay (ring-down) of a mechanical vibration mode. The vibration mode near 1200 kHz is excited with a sinusoidal wave of 1190 kHz, and the decay in free oscillation, after the sinusoidal wave is switched off, is shown.

FIG. 6 shows the measurement result. An exponential decay function $A*Exp(-t/\tau_m)+B$ is fit to the envelope of decay, and the value of $\tau_m$ is found to be 0.03 ms.

Using the fixed frequency range for linear modulation $f_i$=500 kHz and $f_t$=2500 kHz and the value $\tau_m$=0.03 ms obtained in FIG. 6 for the time constant, the following value for the right-hand side of Equation 22 and Equation 23 is obtained.

[Math 25]

$(f_t-f_i)\pi \ln(2)\tau_m^2 = 3.9$ ms <Equation 24>

This value represents the transition time length $T_t$ above which the inspection mode (2) becomes valid and below which the inspection mode (1) becomes applicable.

Figure 7:
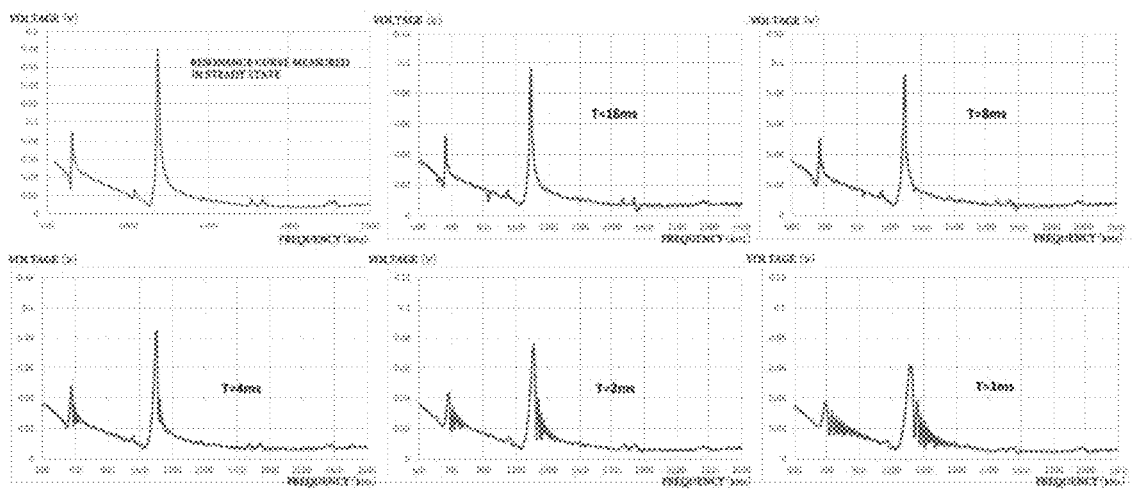
FIG. 7 shows the amplitude envelopes of vibration response voltage measured with different frequency modulation speeds. The initial and terminal frequency for modulation is fixed at $f_i$=500 kHz and $f_t$=2500 kHz, respectively, and the total time length of modulation T is varied.

FIG. 7 shows the amplitude envelopes of vibration response voltage when the modulation time length T is varied from 1 ms to 16 ms, while the frequency modulation range is fixed at $f_i$=500 kHz and $f_t$=2500 kHz. The resonance curve measured with the conventional technique of electromechanical resonance is inserted as a reference. As shown on the plots, in accordance with the value of Equation 24, the envelopes trace the resonance curve for T>4 ms, and transient response, shown as oscillations after a peak, appears for T≤4 ms.

The resonance curve and the envelopes measured with high T are different by a factor of 2. It is caused by the measurement setting that the resonance curve is measured in peak-to-peak voltage whereas the envelopes are in amplitude.

In practical application, the value of T used for computing the transition speed of modulation does not have to be the population mean of the capacitors in the testing group. Measurements from a few reference samples of the same type of capacitors would be sufficient. This is because the application conditions of the inspection mode (1) and mode (2) are given as inequalities, and it is possible to set the frequency modulation speed to a value having a sufficient margin with respect to the variation in physical characteristics between the capacitors.

In FIG. 6, the value of time constant is determined from a decay waveform of a normal vibration mode. The equivalent time constant can be obtained from a ramp-up waveform of the same normal vibration mode. In this case, the measurement may be taken for the build-up of vibration response voltage in a transient response with the input sinusoidal signal whose frequency is tuned to the mode frequency.

In determining the transition speed for the inspection mode (1) or the mode (2), instead of measuring the time constant $\tau$ from a decay or a ramp-up waveform of a normal vibration mode, a trial-and-error approach can be implemented. As in FIG. 7, vibration response voltage from reference capacitors can be measured with varied modulation speeds. The value of the transition speed can be inferred from either the appearance or the non-appearance of transient response in the vibration response voltage, and suitable modulation speed can be decided.

Figures 1, 11A:
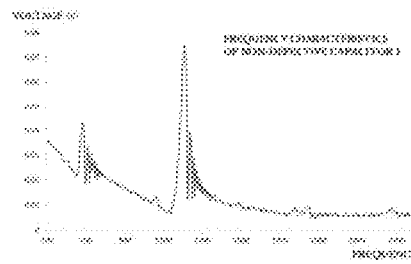
Figures 2, 11A:
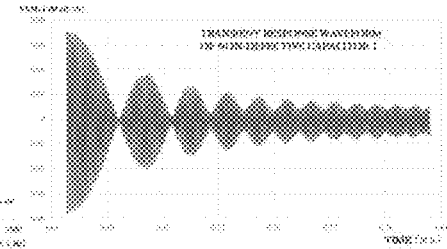

Finally, a range of frequency modulation, from the first frequency $f_i$ to the second frequency $f_t$ that encompasses one or more of normal modes of vibration of the testing capacitors can be identified from the measurements of resonance characteristics of one or more capacitors of the same type. One example of such measurement is the resonance curve measured with the conventional electromechanical resonance technique as shown in FIG. 1.

(Inspection Method 3: Instantaneous Switching of Frequency at the Defined Value of Vibration Response Voltage)

In contrast to the inspection mode (1) and the inspection mode (2) in which the frequency of an input electric signal is continuously modulated in time, the inspection mode (3) generates transient response which contains information of the normal mode of vibration by instantaneously (or discretely) switching the frequency of the input electric signal.

As frequency of the input electric signal is continuously modulated in the vicinity of a normal mode of vibration of the capacitor, the capacitor vibrates in the normal mode and the other normal vibration modes that are coupled to the mode. The energy of vibration builds up in the capacitor, and the magnitude of vibration appears as the amplitude of oscillation in vibration response voltage.

Once the vibration energy is accumulated in the capacitor by the frequency modulation signal, the amplitude of vibration response voltage is increased. When frequency of the input signal is instantaneously switched, making a discrete jump in the input frequency, vibration of the capacitor cannot follow the frequency due to the inertia in the oscillation body, and transient response is generated in the vibration response voltage.

An implementation of the inspection mode (3) of the present invention is such that: a threshold voltage (Vthresh) which is lower than the peak value of a normal vibration mode is applied to vibration response voltage; frequency of the input electric signal is modulated from a first frequency toward the frequency of the normal mode and thus accumulate the vibration energy in the capacitor: when the vibration response voltage reaches the threshold (Vthresh), frequency of the input electric signal is instantaneously switched to another frequency $f_{switch}$ which is different from the instantaneous frequency of the modulation signal at the time of switching, making a discrete jump in the input frequency; and the remnant vibration of the normal mode generates transient response in the vibration response voltage.

In this implementation, the amplitude of vibration response voltage at the time of signal switching is same for all capacitors, and therefore, it is possible to test capacitors under a common vibration energy with transient response.

For the inspection mode (3), no limit is specified for the frequency modulation speed or terminal frequency of modulation of an input electric signal. However, a low modulation speed has an advantage that the vibration energy at the time of switching is matched among the capacitors since the change in the amplitude of vibration response voltage in a given time period is less with low modulation speed, and the amplitude in a given time period has less uncertainties.

The signal after switching may be another modulation signal, but it is preferable to use a signal of a fixed frequency (sinusoidal wave) since separation of the transient response from the vibration response voltage is easier with a sinusoidal wave in the analysis process. Further, the switched signal may be a DC signal ($f_{switch}=0$).

Figure 8:
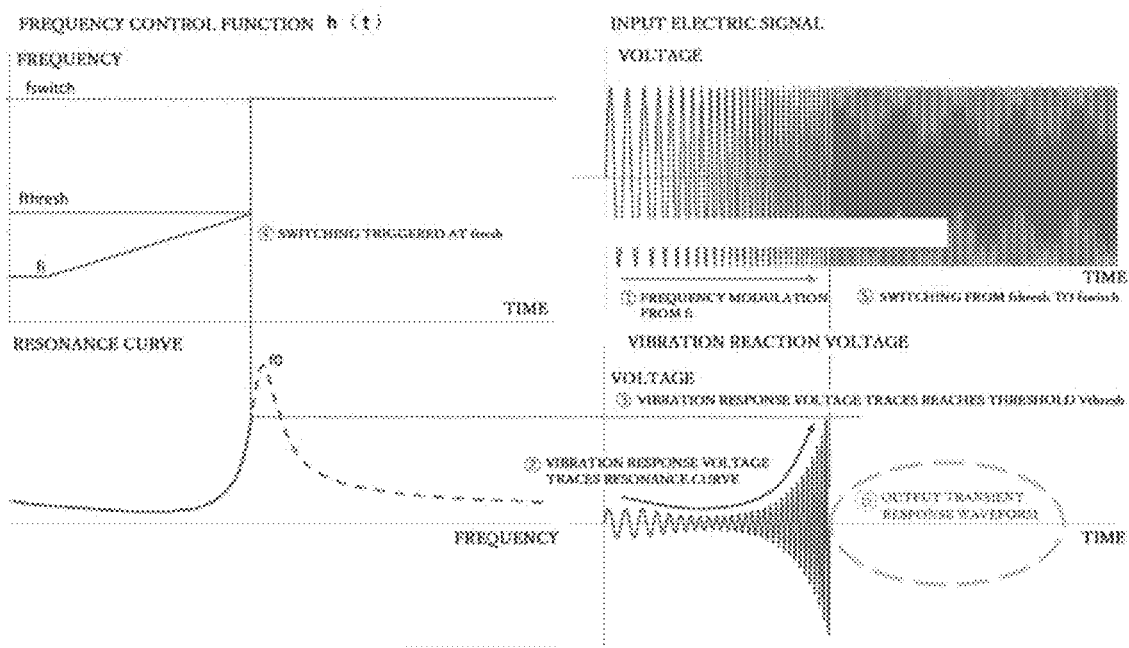
FIG. 8 is a conceptual diagram showing measurement principles of the inspection mode (3). When vibration response voltage exceeds the threshold voltage Vthresh, frequency of the input signal will be switched from $f_{thresh}$ to $f_{switch}$

FIG. 8 shows a measurement concept of the inspection mode (3). In this example, an electric signal is modulated at a low speed to trace the resonance curve with the amplitude of vibration response voltage, and when the amplitude of vibration response voltage exceeds Vthresh, the electric signal is switched to a sinusoidal wave of the frequency $f_{switch}$.

Figure 9A:
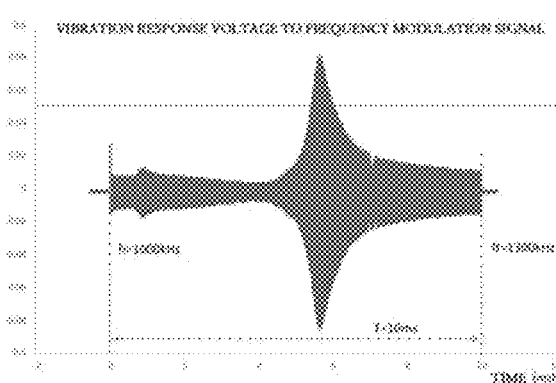
FIGS. 9A to 9C represent a waveform measured with the inspection mode (3).
Figure 9B:
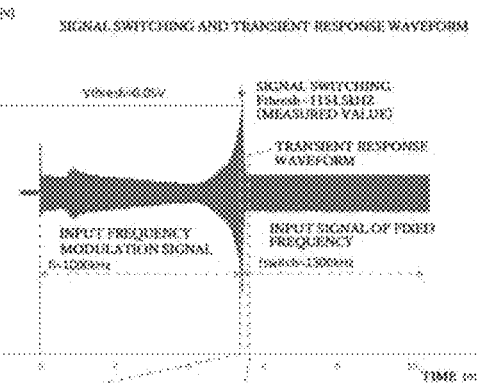
Figure 9C:
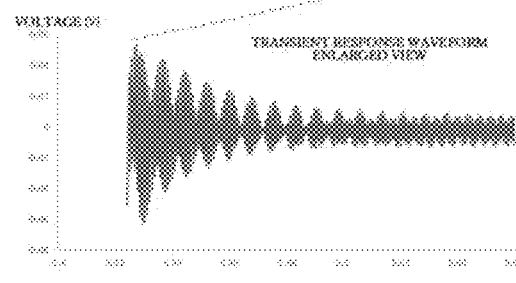

FIGS. 9A to 9C are plots of the real data measured with the inspection mode (3). The target normal vibration mode is at 1200 kHz band. The measurement is performed with parameters set to: $f_i=1000$ kHz, $f_f=1300$ kHz, and T=10 ms for frequency modulation signal: Vthresh=0.05V for threshold voltage of vibration response voltage; and sinusoidal type wave with $f_{switch}=1300$ kHz for signal after switching.

FIG. 9A is a null-case waveform where switching has not occurred, and the amplitude of vibration response voltage traces the resonance curve. It is shown as reference.

FIG. 9B is the waveform of vibration response voltage with the switching occurred at the threshold voltage of 0.05 V. The amplitude of vibration response voltage traces the resonance curve until it reaches 0.05 V, and after the switching, the vibration response voltage converges to a steady state vibration of 1300 kHz.

FIG. 9C is an enlarged view of the waveform of FIG. 9B immediately after the switching. A transient response waveform is shown. The beat phenomena are due to interference of the remnant vibration of the normal mode with the input electric signal.

(A Summary of the Inspection Modes and their Characteristics)

Features and the application conditions of the inspection modes are summarized below.

(Inspection Mode (1))

Frequency of an input electric signal is modulated in a predetermined range at a speed higher than the transition speed given in Equation 18 or Equation 20. This inspection method is capable of simultaneously measuring a frequency characteristic of capacitor and a transient response waveform generated by the remnant vibration of a normal mode.

(Inspection Mode (2))

Frequency of an input electric signal is modulated in a predetermined range at a speed lower than the transition speed given in Equation 17 or Equation 19. This inspection method measures the resonance curve of a capacitor in high precision by tracing the curve with the waveform envelope of vibration response voltage.

(Inspection mode (3))

Frequency of an input electric signal is modulated from a first frequency toward a normal frequency of the target mode of vibration. A certain trigger threshold is imposed to the value of vibration response voltage. When the value of vibration response voltage reaches the trigger threshold, the electric signal is switched to another frequency to generate a transient response waveform in vibration response voltage. This inspection method measures vibration of normal modes at a fixed vibrational energy with reliable reproducibility.

(Method of Extracting Frequency Characteristic or Resonance Curve from Vibration Response Voltage)

In the inspection method of the present invention, a waveform of vibration response voltage is obtained as a function of voltage versus time $V_o(t)$, and an instantaneous frequency of the input signal is given by a frequency control function h(t).

The response of a capacitor to frequency of an input electric signal can be expressed by matching the parameter time in a parametric form as $(h(t),V_o(t))$. This parametric form represents vibration response voltage as an oscillatory function of frequency. $V_o(t)$ oscillates in frequency with varying amplitude.

Frequency characteristics are the amplitude of responses for given frequencies. To find frequency characteristics or a resonance curve from $(h(t),V_o(t))$, one needs an envelope $V_o(t)$ in h(t). Time windows in a constant interval may be used. If, for each j-th time window $T_j$ at $t_j \le t < t_{j+1}$, the average value of h(t) is found to be $f_j$, and the maximum value of $V_o(t)$ is found to be $V_{oj}$, then, the collection of $(f_j,V_{oj})$ can be obtained as a discrete data set which represents frequency characteristics or a resonance curve.

The representative value of the function in the time window $T_j$ does not have to be the average value or the maximum value. Values such as the square root of the mean square, the square root of the maximum value of the squares of the function, the half of the difference between the maximum value and the minimum value, etc. can also be used.

(Measurement with Narrowed Frequency Range)

In the verification example of the inspection method of FIG. 7, frequency is modulated in a relatively wide range containing multiple normal modes of vibration of a capacitor, and frequency characteristics are measured in a wide frequency band. In the inspection method of the present invention, there is no particular limitation on the range of frequency modulation that can be set (as long as the function of the waveform generator permits), and it is also possible to narrow down the range of modulation around a normal mode to measure the mode's response in vibration response voltage with a high time resolution.

(Modulation Scheme)

In the measurement examples shown in FIGS. 7 and 9, frequency of the input signal is linearly modulated from a low frequency to a high frequency. This scheme of modulation is not a requirement of the methods, and for example, frequency modulation from a high frequency to a low frequency, or nonlinear modulation such as sinusoidal, logarithmic, or exponential modulation may be used.

(High Speed of Inspection)

In the inspection method of the present invention, the measurement is performed with a single electric signal or a single set of electric signals with predetermined parameters, and there is no need for repetitive measurements. Thus, the inspection of the present invention is much faster than the conventional techniques. Particularly, in the inspection mode (1), the time scale for measurement is determined by the time constant τ of transient response of a normal vibration mode, and thus, the measurement time is in order of sub-millisecond to several milliseconds.

(Standardization of Measurement Conditions)

In the inspection method of the present invention, an inspection is performed with a set of predefined parameters, and measurements conditions are independent of the physical characteristics of individual capacitor. Since the measurement conditions are not affected by slight variations in

<Vibration Response Voltage Measurement Step (VRVM Step)>

(Separation of Vibration Response Voltage by Filtering)

In the inspection method of the present invention, the waveform of reaction voltage that is output from the capacitor, after the DC bias voltage applying step and the VRVG step, is a superposition of DC bias voltage, vibration response voltage, and transient response.

Therefore, it is preferable to perform filtering of reaction voltage with a filter circuit. The filter circuit is a high-pass filter connected in parallel to the capacitor, and it will separate and remove a DC bias voltage from a reaction voltage to expose a minute vibration response voltage and transient responses.

The filter circuit also serves to separate a measurement terminal of the measurement system from the input terminal of the holder portion. The measurement contacts are placed on a filter element, and thus, the measurement contacts are separated from the input terminal of the holder portion via filter elements. Thus, a large current does not flow through the measurement terminal when an electric signal is input, and it suppresses the adverse effects of the contact resistance or of the line inductance on the measurement terminal.

If an RC high-pass filter is used as a filter circuit, the cutoff frequency of the filter, $1/2\pi\tau$ where $\tau=RC$, needs to be lower than the lowest measurement frequency. Further, to prevent the input impedance of the filter from altering the current flowing through the capacitor being measured, the filter resistance needs to be sufficiently higher than the impedance of the capacitor in the measurement frequency range.

In the present invention, after filtering, the measurement system usually measures a signal in voltage. If an RC high-pass filter is used, current may be used to measure vibration response voltage with an ammeter inserted in series to the filter circuit or the filter capacitor. This is because voltage applied to the resistor of the filter and the current flowing through the resistor is directory proportional, and there is no practical difference in the obtained information whether the current or the voltage is used as the measurement medium.

<Quality Determination Step>

In the present invention, defective capacitors are distinguished from non-defective capacitors based on the differences in the waveforms of vibration response voltage and transient response.

The frequency characteristics or the resonance curve measured in the inspection method of present invention represent mechanical characteristics of the structure of capacitor. A non-defective capacitor and a defective capacitor are different from each other in peak height, peak sharpness (Q value), peak frequency, and the like. Due to internal defects, a defective capacitor may have secondary peaks in the resonance curve which do not exist in a non-defective capacitor.

Q value is an indicator of the soundness of the structure. As expressed by Equation 8, the time constant $\tau$ of the decay rate of a normal mode of vibration is directly related to the Q value, that is, a system having a sound structure will dissipate less energy per cycle by vibration and has a higher value for time constant $\tau$. Thus, for a non-defective capacitor, transient response from remnant vibration of a normal mode lasts for a longer period of time, whereas for a defective capacitor, the transient response vanishes quickly, or the vibration energy is dissipated into the secondary peaks causing additional interferences in the transient response.

Therefore, in the present invention, a defective capacitor can be identified with the extracted transient response waveform from information such as the amplitude, the vibration frequency, the attenuation rate (time constant $\tau$) and interferences.

(Separation of Phase Difference Components)

In the present invention, by squaring the obtained transient response waveform and performing frequency self-mixing, the difference between the phase of the normal vibration mode and the reference phase of an input electric signal can be analyzed in the spectrum of the low-frequency band.

The transient response waveforms that are output in the inspection mode (1) or the inspection mode (3) are interference waveforms in each of which a waveform of vibration of normal modes (transient vibration) is superimposed on a waveform of steady state vibration in phase with the input electric signal. It is the transient vibration component that contains information on the structure of capacitor. In analysis, it is necessary to single out the transient vibration component from a transient response waveform.

In a naïve approach, to extract information on normal vibration modes directly from the spectrum, Fourier transform on the transient response waveform $W_T(t)$ can be performed. it is also possible to analyze the frequency spectrum by directly performing a Fourier transformation or the like. However, when the frequency band of the input electric signal and the frequency $f_0$ of the normal vibration mode are close to each other, their spectra overlap each other, making it difficult to separate. This is particularly the case for the inspection mode (1). (The instantaneous frequency of an input electric signal coincides with $f_0$ of the normal vibration mode when the transient response waveform is generated). In addition, in both the inspection mode (1) and mode (3), the distinguishing between the non-defective product and the defective product is based on a slight difference in transient response. Then, when the spectrum is directly calculated from the transient response waveform $W_T(t)$, the electric signal in the same band as the vibration frequency of the transient response appears as a large noise in the analysis.

A transient response waveform $W_T(t)$, with transient vibration from a normal mode $f_0$, is modeled, as in Equation 25.

[Math 26]

$$W_T(t) = A(t) \cdot \text{Sin}(\phi(t)) + B(t) \cdot \text{Sin}(2\pi f_0 t) \quad \text{<Equation 25>}$$
$$= A(t) \cdot \text{Sin}(2\pi f_0 t + \delta(t)) + B(t) \cdot \text{Sin}(2\pi f_0 t)$$

The first term represents steady-state response of a capacitor to an input electric signal. The phase function $\varphi(t)$ is a set parameter (a function set by a measurer) of the input electric signal and is a known. In the case of the inspection mode (1), the phase function is based on Equation 2, and in the case of the frequency-switching of the inspection method 0, it is given by $\varphi(t)=2\pi f_{switch}t$. Regarding the known phase function $\varphi(t)$ as the reference phase, the difference between $\varphi(t)$ and the phase of the normal vibration mode, $\delta(t)=\varphi(t)-2\pi f_0 t$, can be regarded as deviation of phase of the normal vibration mode from the reference phase. $A(t)$ represents the frequency dependence of a capacitor with time-varying frequency. The second term is a term from transient vibration of a normal mode $f_0$. B(t) represents the exponential attenuation of the transient response.

To simplify the description, the relative phase between two terms is assumed to be 0, but a generalization is possible.

Since the reference phase $\varphi(t)$ is a known function, obtaining information on the phase deviation function $\delta(t)$ is synonymous with obtaining information on the normal vibration mode $f_0$.

Now, a waveform of the square of the transient response waveform $W_T$, as in Equation 25, is considered. Using a product-to-sum formula of trigonometric identities, as shown in Equation 26. Then, as in Equation 27, the terms of the square of $W_T$ can be arranged into phase sum components and phase difference components.

[Math 27]

$$(A \cdot \text{Sin}(x) + B \cdot (y))^2 = \frac{1}{2}(A^2 + B^2) + AB \cdot \text{Cos}(x - y) - \frac{1}{2}A^2 \cdot \text{Cos}(2x) - \frac{1}{2}B^2 \cdot \text{Cos}(2y) - AB \cdot \text{Cos}(x + y)$$ <Equation 26>

[Math 28]

$$W_T^2(t) = \frac{1}{2}(A^2(t) + B^2(t)) +$$ <Equation 27>

$$A(t) \cdot B(t) \cdot \text{Cos}(\delta(t)) - \text{(phase sum component)}$$

A phase sum component oscillates in the order of twice the normal vibration mode frequency $f_0$. When the spectrum of Equation 27 is taken, the first 3 terms of Equation 27 including $\delta(t)$ appear in the low-frequency band (~0 Hz) and the phase sum component appears in the high-frequency band (~$2f_0$), respectively. Therefore, in an spectrum analysis such as Fourier transformation, $\delta(t)$ appears in the low-frequency band spectrum in the squared waveform of a transient response (that is, the spectrum is found after self-frequency mixing of the waveform).

A resonance of a non-defective capacitor has a narrow bandwidth, a modeling of the resonance with single normal vibration $f_0$ as in Equation 25 is valid.

Further, in a non-defective group of capacitors with homogeneous mechanical characteristics, a value of normal frequency $f_0$ falls within a certain range, and thus, values of the phase deviation function $\delta(t)$ for each capacitor in the group is also confined in a range. Then the low-frequency spectrum of Equation 27 takes a specific distributed shape.

On the other hand, a resonance of a defective capacitor has a wide bandwidth, and it is natural that the mechanical vibration in a transient response waveform is modeled with multiple frequency modes. The frequencies of these modes are generally different from the corresponding normal mode frequency $f_0$ of a non-defective capacitor. If the vibration of a defective product is expressed by the two modes with frequencies $f_1$ and $f_2$, then in correspondence to Equation 25, a transient response waveform of a defective product is modeled as in Equation 28.

[Math 29]

$$W_T'(t) =$$ <Equation 28>

$$A(t) \cdot \text{Sin}(2\pi f_0 t + \delta(t)) + C(t) \cdot \text{Sin}(2\pi f_1 t) + D(t) \cdot \text{Sin}(2\pi f_2 t)$$

When this waveform is squared, the phase difference component is given by the following Equation 29.

[Math 30]

$$W_T'^2(t) = \frac{1}{2}(A^2 + C^2 + D^2) + A \cdot C \cdot \text{Cos}(2\pi(f_0 - f_1)t + \delta(t)) +$$ <Equation 29>

$$A \cdot D \cdot \text{Cos}(2\pi(f_0 - f_2)t + \delta(t)) C \cdot D \cdot \text{Cos}(2\pi(f_1 - f_2)t) -$$

(phase sum component)

(A, C, and D are functions with time dependence, but the dependence is omitted in order to simplify the expression)

In contrast to the non-defective product model (Equation 27) in which the vibration component of the waveform is only $\text{Cos}(\delta(t))$, in the defective product model (Equation 29), interferences of the secondary modes of $f_1$ and $f_2$ appear in the phase difference components. They give a direct change in the low-frequency band spectrum.

As described above, first squaring the transient response waveform (performing self-mixing of frequencies) and then to analyze the spectrum in the low-frequency region is an effective technique of analysis. This technique is especially suited for the inspection mode (1) and mode (3) in which the frequency band of input electric signal is close to the frequency band of a capacitor's normal vibration mode. Taking the phase of input electric signal as the reference phase, the technique uses the phase deviation of a normal vibration mode from the reference phase as an accurate measure to distinguish a defective capacitor from non-defective ones.

$A^2(t)$ in Equation 27 is a term that depends on impedance of the capacitor, and therefore its value is suppressed when the input electric signal is in a high frequency range, i.e., when the frequency f of the electric signal is much larger than 1/C.

$B^2(t)$ is a term representing exponential attenuation of a normal mode in the transient response waveform. Under Fourier transform, it appears as a Lorentz distribution having maximum at 0 Hz. The particular case of Fourier cosine transform is given in Equation 30. Here $V_0$ is the peak value of a normal vibration mode and $\tau$ is the attenuation time constant of the mode.

[Math 31]

$$\mathcal{F}(B^2(t)) = \mathcal{F}\left(V_0^2 \exp\left(-\frac{2t}{\tau}\right)\right)$$ <Equation 30>

$$= \sqrt{\frac{2}{\pi}} \int_0^\infty V_0^2 \exp\left(-\frac{2t}{\tau}\right) \text{Cos}(\alpha t) dt$$

$$= \sqrt{\frac{2}{\pi}} V_0^2 \frac{\frac{2}{\tau}}{\left(\frac{2}{\tau}\right)^2 + \alpha^2}$$

The maximum value of the Lorentz distribution occurs at $\alpha=0$. Substituted to Equation 30, the following Equation 31 is given.

[Math 32]

Maximum value of distribution at 0 Hz $= \sqrt{\frac{2}{\pi}} \cdot (\tau/2)$ <Equation 31>

Since the maximum value of the Lorentz distribution is higher as τ is larger (that is, as the Q value of a normal mode is higher), for a normal mode of vibration with a high Q value, the intercept at 0 Hz of the spectrum appears at a higher value. Therefore, if the value at 0 Hz is extrapolated from the low-frequency band spectrum, or if the value of the minimum frequency of the spectrum is regarded as the value at 0 Hz, it is possible to obtain an indicator of Q value from the spectrum, which is a useful measure for distinguishing a defective capacitor from non-defective ones.

EXAMPLES

Examples implementations of the inspection mode (1), the inspection mode (2), and the inspection mode (3) are given below. Vibration response voltage, the frequency characteristics, and transient response waveforms of capacitors are measured, and distinction or classification of defective capacitors is performed. However, the present invention is not limited by these examples.
(Experiment Samples)
The experiment samples are consist of 500 multilayer ceramic capacitors (MLCC) having a shape of 3.2 mm in length, 1.6 mm in height, 1.6 mm in width, capacitance of 10 μF, rated voltage of 35 V, and temperature characteristic of X5R. The samples have the same product number, and they are commercially available.
(Non-Defective Group)
The non-defective group is constituted of 118 capacitors randomly sampled from the experiment samples.
(Capacitors with Internal Defects)
To four groups of capacitors each consists of 42 samples, different stresses are respectively applied to each group in attempts to generate defects in the capacitors. The applied stress for each group is listed as follows.
   Group I) rapid heating: from a room temperature, immerse a capacitor into liquid nitrogen (−196° C.), and after the temperature is stabilized, immerse the capacitor in a liquid metal (350° C.) to apply a thermal shock to the capacitor. This is repeated three times.
   Group II) heat quench: from a room temperature, place a capacitor on a liquid metal (350° C.) to heat the capacitor, and after the temperature is stabilized, immerse the capacitor in liquid nitrogen to apply a thermal quench shock to the capacitor. This is repeated twice.
   Group III) physical impact: fix the terminal electrodes of the capacitor from above and below by metal jigs, and drop a cylindrical metal fitting having a weight of 31 g by free fall from a height of 10 cm to bring the bottom surface of the metal fitting into contact with the jigs. This is repeated twice.
   Group IV) physical impact by iron ball: fix the terminal electrodes of the capacitor from above and below by metal jigs, and drop an iron ball having a weight of 28 g by free fall from a height of 9 cm to make contact with the jigs. This is repeated twice.

After applying the stresses, the resonance curves of the capacitors of Groups I to IV are measured with a conventional technique of electromechanical resonance with step frequency sweep, and the capacitors having a peak value of 0.170 V or less in the 1190 kHz band are identified as defective.

The defective capacitors are visually inspected by an inspector, and the defective capacitors whose defects appear to the outside are classified as externally defective capacitors, and those without outside defects under the visual inspection are classified as internally defective capacitors.

Figure 10A:
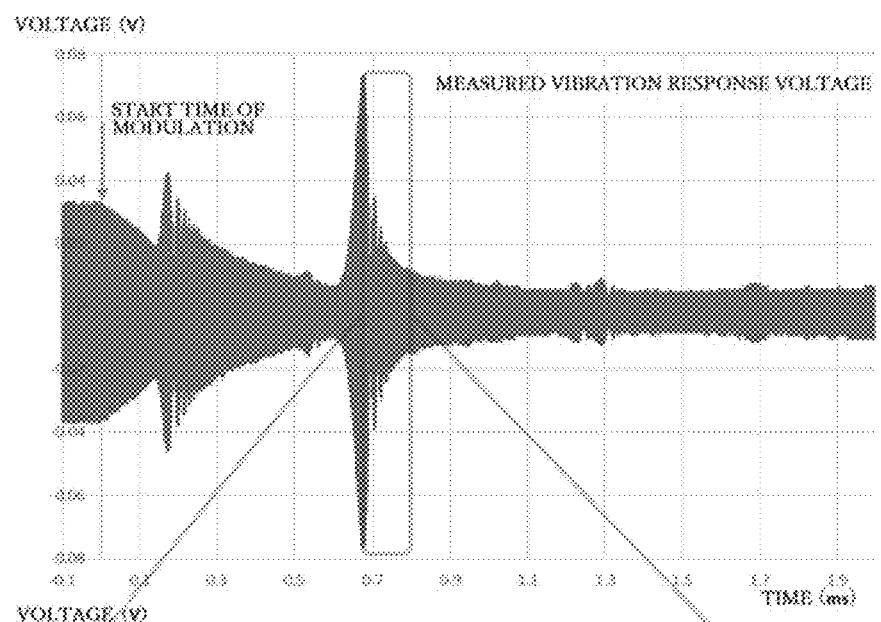
FIGS. 10A to 10C represent a measurement of non-defective capacitor with the inspection mode (1). The initial frequency and terminal frequency of modulation are set to $f_i$=500 kHz, $f_t$=2500 kHz with the total time length of modulation T=2 ms.
Figure 10B:
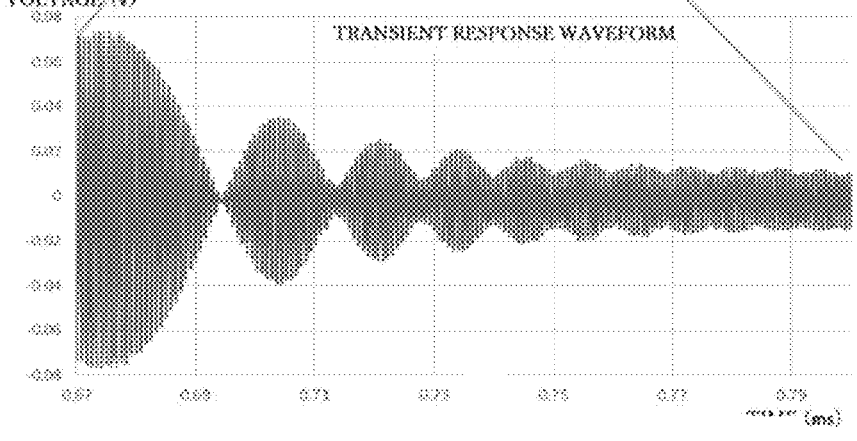
Figure 10C:
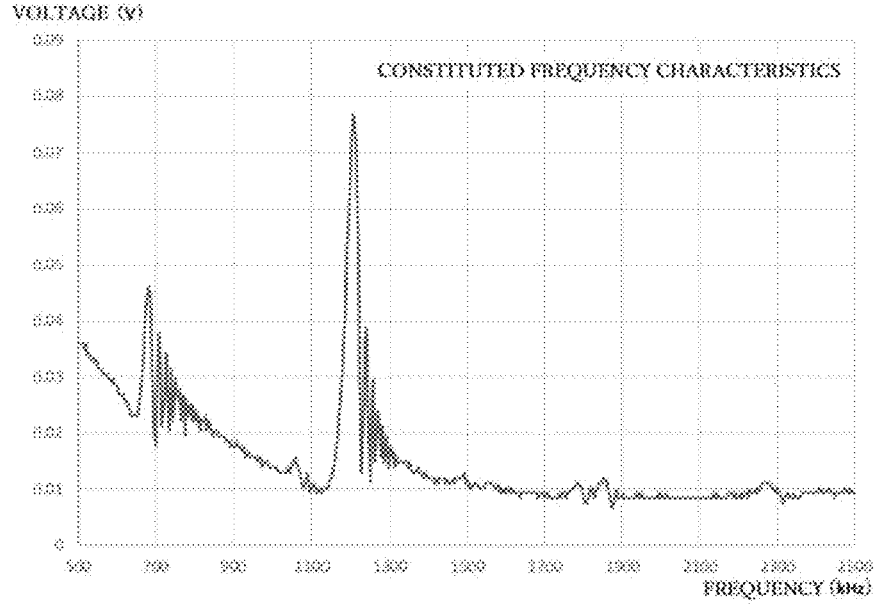

The number of capacitors classified as internally defective is 11 in Group I, 17 in Group II, 7 in Group III, and 10 in Group IV.
(Apparatus Configuration and Filter Circuit)
In the following examples, in accordance with FIG. 17, the apparatus is configured with a bridge resistor as a constant current circuit, an oscilloscope (Agilent InfiniiVision DSO-X-3024A) as a voltage/current measuring device, and a 12.0 V DC bias voltage supply. For the filter circuit, RC high-pass filter circuit having a cutoff frequency of 50 kHz is used.
(Defect Determination with the Inspection Mode (1))
Below, implementation examples of the inspection mode (1) will be described.
(Features of Waveform and the Identification of Defect with the Inspection Mode (1))
FIG. 10 shows a measurement result of a non-defective capacitor with the inspection mode (1). FIG. 10A shows a waveform of vibration response voltage. FIG. 10B shows the generated transient response waveform from a normal vibration mode. FIG. 10C shows the frequency characteristics obtained from (A). An input electric signal of linear frequency modulation with $f_i$=500 kHz, $f_f$=2500 kHz, and T=2 ms is used in the measurement.

For each of non-defective capacitor, a waveform similar to FIG. 10A will appear with a small variation.

In FIG. 11, transient response waveforms and the corresponding frequency characteristics measured with the inspection mode (1) are shown. Comparisons are made between a non-defective capacitor and defective capacitors. An input electric signal of linear frequency modulation with $f_i$=500 kHz, $f_f$=2500 kHz, and T=2 ms is used in the measurement. The transient response waveforms are taken from the normal mode in the 1200 kHz band.

As shown in FIG. 11A-1 of the frequency characteristic curve, the resonance peak of the non-defective capacitor appears sharply with a high Q value. In addition, high frequency modes above the 1200 kHz band are clearly identified.

On the other hand, as shown in FIG. 11E-1 and FIG. 11B-2, the peaks of defective capacitors appear with low Q values, and peaks correspond to high frequency modes are poorly resolved.

In the transient response waveform of the non-defective product, as shown in FIG. 11A-2, a clear interference pattern (that is, a beat phenomenon) having a constant period continues for a long time. This is because the soundness of the structure of the non-defective capacitor is high and the energy dissipation is small, and a normal mode of vibration persists.

Figures 1, 11B:
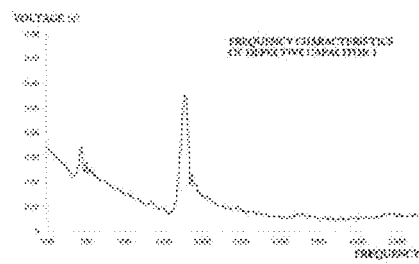
Figures 2, 11B:
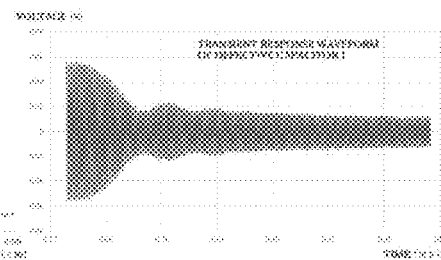
Figures 1, 11C:
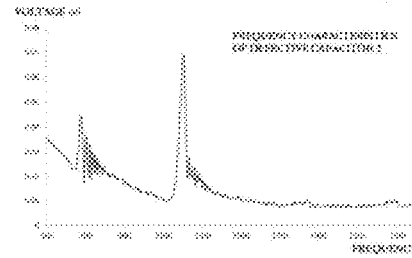
Figures 2, 11C:
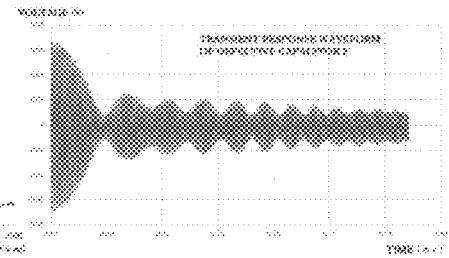

On the other hand, in the defective capacitor, as shown in FIG. 11B-2, the transient response waveform does not persist, and the interference waveform disappears in a short time. It is considered that vibration energy is dissipated by internal defects. As shown in FIG. 11C-2, in certain cases for defective capacitors, the interference persists, but the attenuation rate and the beat frequency are not constant. It is implied that secondary modes exist in the vicinity of the normal mode and additional interferences due to the secondary modes are mixed into the transient response waveform.
(Data Set for Defect Classification)
A dataset is taken for classification of defects, with the inspection mode (1) and using a linear modulation signal set to $f_i$=500 kHz, $f_f$=2500 kHz, and T=1 ms. The waveforms of vibration response voltage are measured for non-defective capacitors and defective capacitors.

(Extraction of a Transient Response Waveform and Separation of Phase Difference Components)

For each data of a vibration response voltage waveform, the peak at 1190 kHz band is identified with the maximum value of the waveform, and 4096 pieces of data starting from the peak position are extracted as the transient response waveform.

As described above, the difference of a defective capacitors from non-defective capacitors is apparent in the beat phenomenon, a feature of the phase difference component.

To single out phase difference components, frequency mixing is performed by squaring the extracted transient response waveform. The squared waveforms are then converted to spectrum data with discrete cosine transformation, and the low-frequency components of the spectrum are analyzed.

Figure 12:
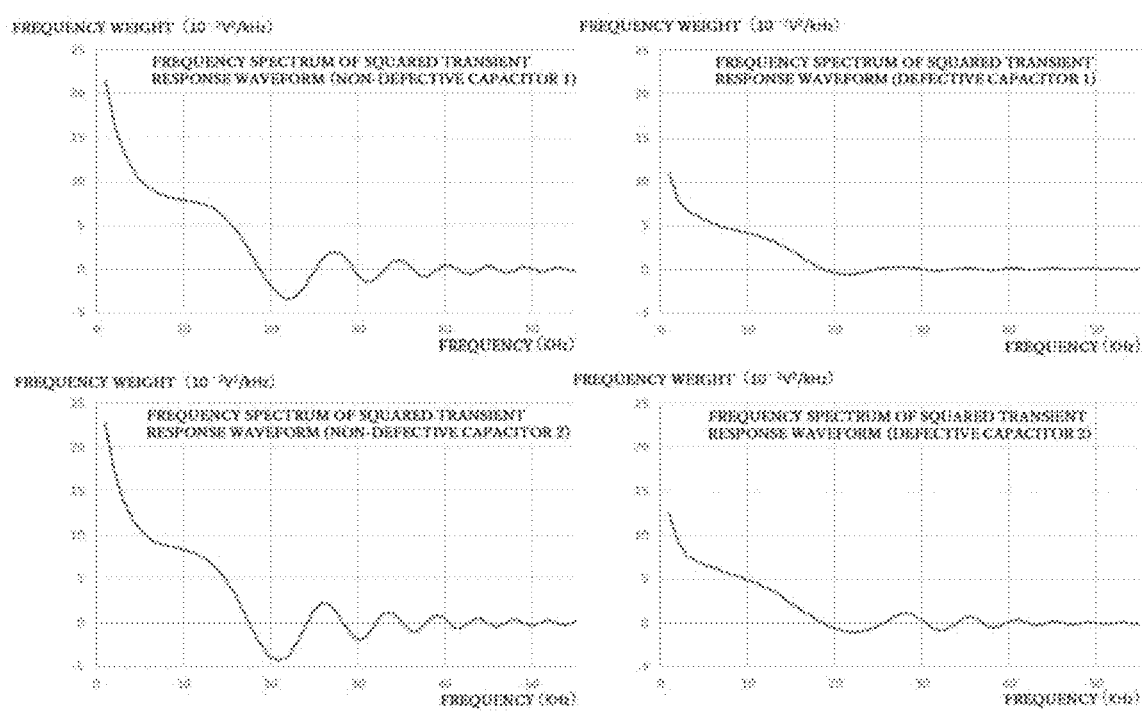
FIG. 12 shows low-frequency band spectrums of the squared waveform of vibration response voltage for both defective and non-defective capacitors.

FIG. 12 shows typical examples of low-frequency spectra of squared waveforms for both non-defective capacitors and defective capacitors. As shown in the plots, the shapes of the spectra are clearly different for defective capacitors from the non-defective capacitors, signaling the difference in the phase difference components. Further, the value in the vicinity of 0 Hz of the spectrum of each non-defective capacitor is clearly higher than that of each respective defective capacitor, indicating that the Q value of the defective capacitor is low.

(PCA Analysis)

In order to quantify degree of defect of defective capacitors, the principal component analysis (PCA) is performed using each 85 points of the lowest frequencies of spectrum as a data vector. From frequency spectra of the non-defective capacitor group, the first 80 frequency spectra are used to construct the PCA basis and the average value vector to characterize non-defective capacitor. For each of the remaining 38 capacitors in the non-defective group, and capacitors in the defective groups I, II, III, and IV, the average value vector is subtracted from the data vector, and the resultant vector is projected onto the PCA basis to obtain PCA scores.

Figure 13A:
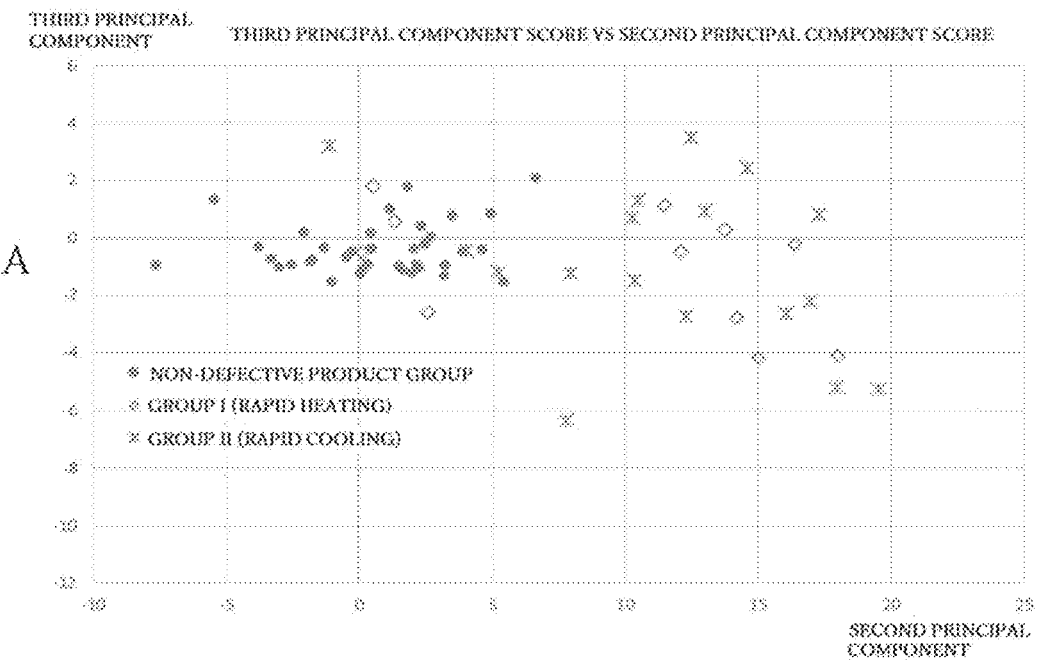
FIGS. 13A to 13B are classification graphs for defective and non-defective capacitors. Sets of values from low-frequency band spectrum are projected onto a PCA basis to find PCA scores, and third principal component scores are plotted against second principal component scores.
Figure 13B:
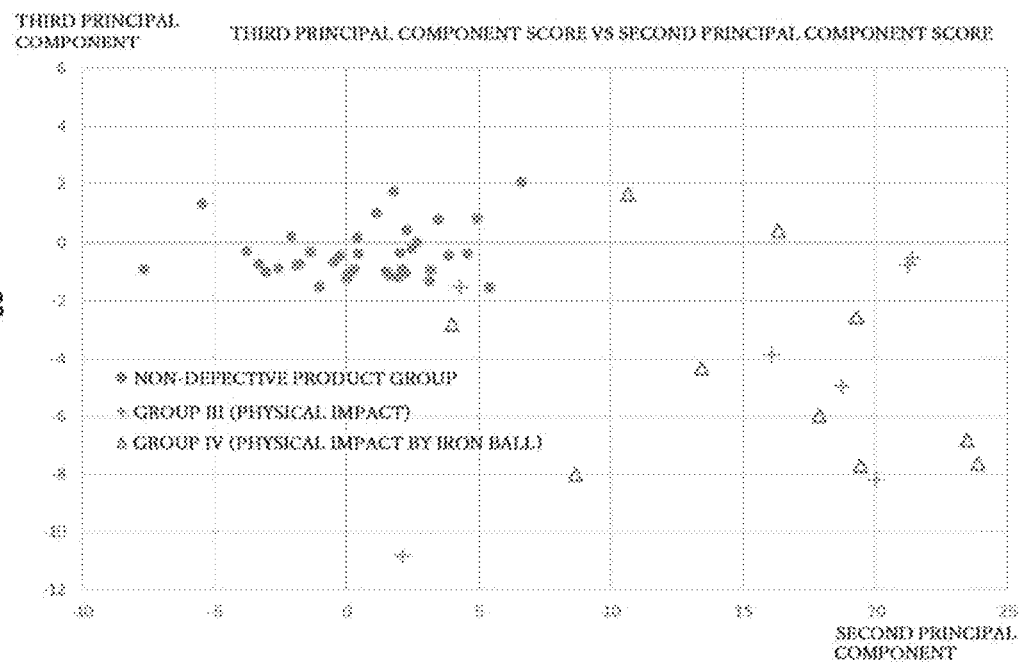

FIGS. 13A to 13B are classification plots in which third principal component is plotted against second principal component for each capacitor in the group. In the plots, it is shown that the non-defective capacitors are collectively distributed around the origin, whereas the defective capacitors are distributed apart from the non-defective group with a few exceptions. Therefore, by setting acceptance ranges (in an area, a box, or even a hypersphere, for example) to the PCA score vector, it is possible to make binary classification of capacitors into defective or non-defective product.

In the above example of PCA analysis and classification, the classification of defective capacitor depends entirely on the spectrum data. Other information such as peak frequency or peak amplitude, and the like can be included in the classification parameters for higher rate of detection of defective product. In addition, other technology such as pattern recognition by machine learning, AI, or the like can be incorporated to extract features from the spectrum data and to make classification or distinction of defective capacitors.

(Defect Determination by Inspection Mode (2))

In FIG. 14, FIG. 14A shows waveform of a vibration response voltage measured with the inspection mode (2), and FIG. 14B shows a resonance curve obtained from the vibration response voltage. The input electric signal of linear frequency modulation is set to $f_i$=500 kHz, $f_f$=2500 kHz, and T=16 ms.

FIG. 14. represents a typical waveform of a non-defective capacitor.

FIG. 15 shows comparisons of resonance curves constructed from vibration response voltage waveforms when the inspection mode (2) is applied. The input electric signal of linear frequency modulation with $f_i$=500 kHz, $f_f$=2500 kHz, and T=16 ms is used in the measurement.

Comparisons are made between a non-defective capacitor and defective capacitors. FIG. 15A-2, FIG. 15B-2, and FIG. 15C-2 each shows a resonance curve constructed from non-defective capacitor 1, defective capacitor 3, and defective capacitor 4, respectively.

As reference, resonance curves measured with the conventional technique of electromechanical resonance is shown in FIG. 15A-1, FIG. 15B-1, and FIG. 15C-1 for non-defective capacitor 1, defective capacitor 3, and defective capacitor 4, respectively. The factor of 2 difference between the resonance curve of the inspection mode (2) and those of the conventional technique is caused by the measurement setting that the curves are in amplitude for the inspection mode (2), whereas for the conventional method, they are in peak-to-peak voltage.

The features of resonance curves measured by the inspection mode (2) matches with the respective resonance curves measured by the conventional method.

As shown in FIG. 15A-2, the resonance peak of a non-defective capacitor appears sharply with a high Q value, but as shown in FIG. 15B-2 and FIG. 15C-2, the resonance peaks of defective capacitor are with wide peak frequency band and have low Q values. Further, in FIG. 15B-2 and FIG. 15C-2 of defective capacitors, secondary peaks are observed on the resonance curves.

Therefore, a defective capacitor can be identified from the features of its resonance curve.

(Defect Determination by the Inspection Mode (3))

The inspection mode (3) is implemented to measure both defective and non-defective capacitors. The target normal vibration mode is at 1200 kHz band. The input modulation signal is set to be a linear modulation signal with $f_i$=1000 kHz, $f_f$=1300 kHz, and T=10 ms. Vthresh=0.035 V is applied to the vibration response voltage. The signal after switching is a sinusoidal wave of $f_{switch}$=1300 kHz.

The transient response waveforms obtained in the measurement is squared, and discrete cosine transform is performed to the squared waveforms to analyze the spectrum in the low-frequency band.

Results of implementing the inspection mode (3) are presented in FIG. 16. Waveforms of transient response and the corresponding low frequency spectra are shown in the figure.

Figures 1, 16A:
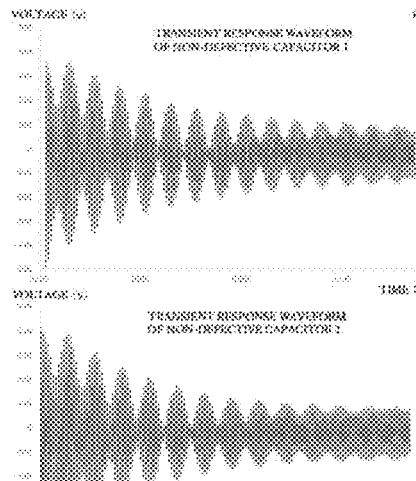
Figures 2, 16A:
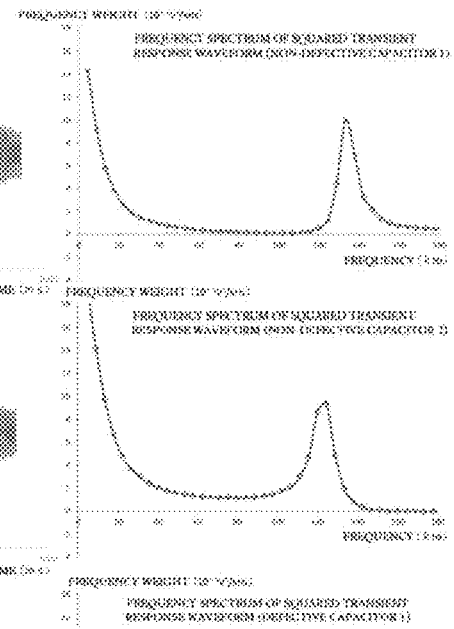
Figures 1, 16B:
Figures 2, 16B:
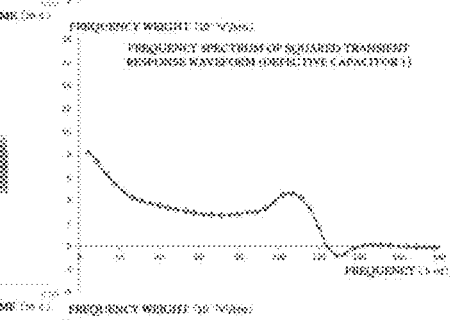
Figures 1, 16C:
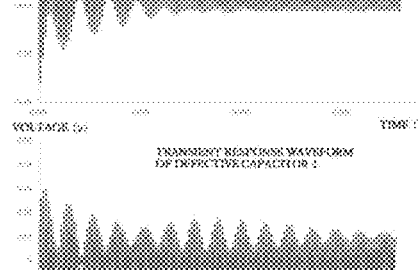
Figures 2, 16C:
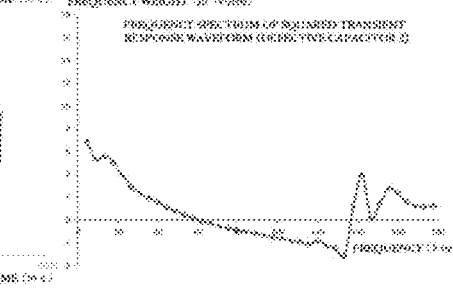
Figures 1, 16D:
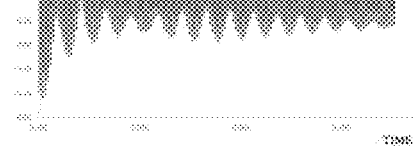
Figures 1, 16D:
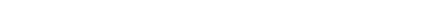

FIGS. 16A-1 and 16B-1 are the waveforms of transient response from non-defective capacitors. Typical beat phenomena of the interference of two modes appear, and the phenomena persist for the measurement time window. Comparing, FIGS. 16C-1 and 16D-1 are the transient response waveforms of the defective capacitors. In FIG. 16C-1, a weak beat phenomenon appears, and it disappears in the measurement time window. In FIG. unstable beat phenomenon persists in the time window. Both the period and amplitude of the beat varies implying disturbance from the secondary modes.

For non-defective capacitors, each of low-frequency band spectrum have a large weight at the spectrum's lower limit (~0 kHz) and a clear peak in the vicinity of 120 kHz (FIG. 16A-2, FIG. 16B-2).

In contrast, each of the low-frequency spectrum of defective capacitors has a small frequency weight at the spectrum lower limit, and the beat frequency peak is disturbed such that the peak height is low (FIG. 16C-2) or the peak is divided (FIG. 16D-2).

Therefore, a non-defective product and a defective product can be clearly distinguished from each other based on the spectrum in the low-frequency band.

From the above results, it is understood that the internal defects of capacitors can be detected with high accuracy by applying an inspection mode of the present invention.

<Apparatus Configuration>

In the following, the inspection apparatus to implement the capacitor inspection method of the inspection mode of the present invention will be described in detail.

The capacitor inspection apparatus of the present invention, in a basic configuration, includes: a holder portion to place an inspecting capacitor, power supply devices including a DC bias voltage supply and a waveform generator which are connected to the input side of the holder portion; a constant current circuit that is connected in series between the holder portion and the waveform generator: and a filter circuit that is connected in parallel to the holder portion.

Figure 17:
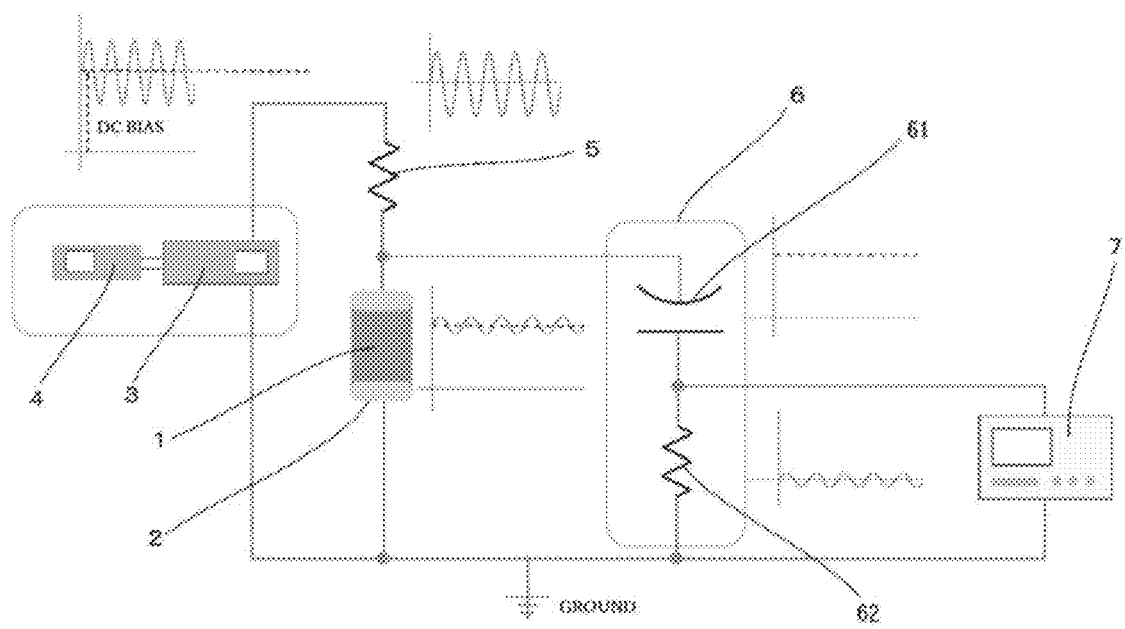
FIG. 17 is a schematic diagram showing a basic configuration of the capacitor inspection apparatus according to the present invention.

FIG. 17 shows a schematic configuration diagram of one embodiment of the capacitor inspection apparatus according to the present invention.

The inspection apparatus of the present embodiment includes a holder portion (Holder Portion 2) for a capacitor (Capacitor 1) to be inspected, a bias voltage supply (Bias Voltage Supply 3), a waveform generator (Waveform Generator 4), a constant current circuit (Constant Current circuit 5), a filter circuit (Filter Circuit 6), and a voltage/current measuring device (Voltage/current Measuring Device 7).

(Holder Portion)

Holder portion 2 is an inspection stage on which Capacitor 1 is placed in a manner that the terminal electrodes of Capacitor 1 make electrical contacts with external devices and external circuits, Size, shape, and the forms of electrical contact of Holder portion 2 can be appropriately set in accordance with the type, size, and the like of Capacitor 1.

(Bias Voltage Supply)

Bias Voltage Supply 3 applies a DC bias voltage to Capacitor 1. Types of the power supply that can be used are not limited as long as it can supply a predetermined bias voltage equal to or lower than the rated voltage of Capacitor 1. For example, Bias voltage supply can be a storage battery, a stabilized power supply, a device capable of generating a rectangular wave having a relatively long span, or a function generator that creates a voltage waveform having a sufficiently small change in value within a measurement time.

(Waveform generator)

Waveform Generator 4 is a device that generates an electric signal and inputs the signal to Capacitor 1. The device needs to have a function that: outputs a frequency modulation signal that modulates frequency in a defined range at given rates for modulation; or outputs a frequency modulation signal and then switches the output to another signal. Specifically, a function generator can be suitably used.

(Constant Current Circuit)

Constant Current Circuit 5 is a circuit that is connected in series to Holder portion 2. It is provided to make the power drawn from Waveform Generator 4 constant regardless of the frequency of the output waveform and to stabilize the reaction voltage from Capacitor 1. Constant Current Circuit 5 outputs a current proportional to the input voltage.

Since the impedance of a capacitor is inversely proportional to frequency, if a waveform generator is directly connected to a capacitor, the voltage input from a waveform generator is easily affected by parasitic resistance, small parasitic inductance, or output impedance of the generator. It becomes increasingly difficult to drive capacitor under constant voltage condition at higher frequency.

Moreover, the phase of current leads that of voltage by 90° in capacitor. When a capacitor is directly connected to a waveform generator, due to the output impedance and the oscillation characteristics of the waveform generator, the voltage input from the waveform generator to the capacitor can become unstable.

In the present invention, Constant Current Circuit 5 is connected in series with Capacitor 1. The input impedance $|Zin|$ of Constant Current Circuit 5 is required to be sufficiently larger than the impedance $|Zc|$ of Capacitor 1 in the measurement range of frequency.

Seen from Waveform Generator 4, the input impedance of the circuit now becomes Zin+Zc dominated by Zc in the measurement range of frequency. As the input impedance to Waveform Generator 4 becomes sufficiently large in the measurement range of frequency, the output impedance of Waveform Generator 4 no longer affects its output voltage. In addition, the phase difference between the output current and voltage of Generator 4 will be reduced, stabilizing the voltage output of Waveform Generator 4.

It is required that the output impedance $|Zout|$ of Constant Current Circuit 5 is sufficiently larger than the impedance $|Zc|$ of Capacitor 1 in the measurement range of frequency. Then, Constant Current Circuit 5 supplies current to Capacitor 1 in proportion to the input voltage without being affected by parasitic impedance or the frequency-depended impedance of Capacitor 1. As the result, the vibration response voltage and hence the reaction voltage that is output form Capacitor 1 is stabilized under constant current drive.

The simplest form of the constant current circuit is a resistor having a resistance value sufficiently larger than the impedance $|Zc|$ of the capacitor 1 in the frequency measurement range.

Further, an inductor may be connected in parallel to the constant current circuit resistor to provide countermeasures against high-frequency noise and the oscillation of Waveform Generator 4.

(Filter Circuit)

Filter Circuit 6 is a high-pass filter circuit which is connected in parallel to Holder Portion 2. It removes a DC bias voltage from the reaction voltage of Capacitor 1 to single out the vibration response voltage. An RC high-pass filter circuit constituted of Filter Capacitor 61 and Filter Resistor 62 can be used for Filter Circuit 6. When Voltage/current Measuring Device 7 measures voltage, one end of Filter Resistor 62 is grounded.

(Voltage/Current Measuring Device)

Voltage/current Measuring Device 7 measures vibration response voltage and transient response waveforms. A general voltage/current measuring device with an appropriate bandwidth can be used, provided it has a trigger function that can be conditioned to a frequency control function or the switching of input electric signals. For Voltage/current Measuring Device 7, a general oscilloscope can be used. A spectrum analyzer or a signal analyzer can also be used which measures the vibration response voltage in form of a spectrum.

According to the inspection apparatus of the above-described embodiment, the inspection apparatus can be constituted of Capacitor 1 to be inspected, Holder Portion 2 on which Capacitor 1 is mounted, a power system that includes Bias Power Supply 3 for applying a DC bias voltage and Waveform Generator 4 for generating an electric signal, Constant Current Circuit 5 to keep constant input power from the power system, Filter Circuit 6 that is connected in parallel with Capacitor 1 through Folder Portion 2, and Voltage/current Measuring Device 7 that measures the response of Capacitor 1 through Filter Circuit 6, and thus, the apparatus configuration is simple, and the entire inspection system can be constituted at a low cost and in a small space.

Although the capacitor inspection method and the capacitor inspection apparatus according to the present invention have been described above based on the embodiments, the present invention is not limited to the above-described embodiments, and various changes can be made in the scope of not departing from the gist of the present invention.

For example, although the electronic component to be inspected has been described as a capacitor in the above-described embodiments, the present invention, in principle, can be applied to inspection of other electronic components such as ferrite beads or laminated battery which has electrodes and made of dielectric material.

REFERENCE SIGNS LIST

1 Capacitor
2 Holder Portion
3 Bias Power Supply
4 Waveform Generator
5 Constant Current Circuit
6 Filter Circuit
61 Filter Capacitor
62 Filter Resistor
7 Voltage/current Measuring Device

The invention claimed is:

1. A method of inspection for a group of a same type of capacitors comprising:
    applying a DC bias voltage equal to or lower than the rated value of the group to a capacitor; and
    generating a vibration response voltage including inputting an electric signal whose frequency continuously changes with time to a capacitor, causing mechanical vibration in the capacitor, generating a vibration response voltage from the capacitor, and outputting superposition of the DC bias voltage and the vibration response voltage as reaction voltage.

2. The method of inspection for a group of a same type of capacitors according to claim 1, wherein, in said generating the vibration response voltage, said electric signal is continuously modulated from a first frequency to a second frequency, and at least one frequency of normal modes of vibration for the capacitor group which are identified prior to inspection from the measurements of one or more capacitors of the same type is contained in the range of frequency modulation.

3. The method of inspection for a group of a same type of capacitors according to claim 1, wherein a speed of frequency modulation in said generating the vibration response voltage is set to a common value or a function for the capacitor group and not varied for each capacitor; the speed of frequency modulation is set based on certain transition speeds that are already determined prior to inspection; and a transition speed is determined by a time constant found from the waveforms of one or more capacitors of the same type measured in the decay or ramp-up of a normal mode of vibration contained in the expected range of frequency modulation, or by trial-and-errors of observing transient response in vibration response voltage in one or more capacitors of the same type with varied frequency modulation speed.

4. The method of inspection for a group of a same type of capacitors according to claim 1, wherein, in said generating the vibration response voltage, the frequency of the input electric signal is modulated faster than a transition speed, the vibration generated in the capacitor contains transient vibration, and the vibration response voltage contains a transient response.

5. The method of inspection for a group of a same type of capacitors according to claim 1, wherein, in said generating the vibration response voltage, a time parameter of a frequency control function used for frequency modulation is matched to the time of a measured vibration response voltage to obtain a voltage response as a function of frequency or a resonance curve.

6. The method of inspection for a group of a same type of capacitors according to claim 1, wherein, in said generating the vibration response voltage, the frequency of the electric signal applied to the capacitor is continuously modulated, and when a value of said vibration response voltage or said reaction voltage reaches a predetermined threshold, the frequency of the electric signal is switched to another frequency different from the instantaneous frequency of the modulation at the time of the switching, generating transient mechanical vibration in the capacitor and causing transient response in the vibration response voltage of the capacitor.

7. The method of inspection for a group of a same type of capacitors according to claim 1, further comprising: identifying and measuring said vibration response voltage from said reaction voltage; and determining a quality of the capacitor by comparing features of a waveform of vibration response voltage measured in said identifying and measuring the vibration response voltage against those that are measured previously from one or more capacitors of the same type.

8. The method of inspection for a group of a same type of capacitors according to claim 7, wherein, in said determining the quality of the capicator, on a transient response portion of a measured waveform of vibration response voltage, self-mixing of frequencies is performed by squaring the values of the transient response portion of the measured waveform and the quality of the capacitor is determined based on the low frequency band spectrum of the squared waveform.

9. The method of inspection for a group of a same type of capacitors according to claim 7, wherein, in said identifying and measuring the vibration response voltage, the DC bias voltage is removed from said reaction voltage and said vibration response voltage is singled out by a filtering process.

10. A capacitor inspection apparatus comprising:
    a holder portion to place an inspecting capacitor;
    power supply devices including a bias voltage supply and a waveform generator which are connected to the input side of the holder portion;
    a constant current circuit connected in series between the holder portion and the waveform generator; and
    a filter circuit connected in parallel to the holder portion,
    wherein said bias voltage supply applies a DC bias voltage to a capacitor;
    wherein said waveform generator outputs an electric signal whose frequency is continuously modulated from a first frequency to a second frequency, or outputs a signal whose frequency is continuously modulated and then switched to the other frequency that makes a discrete jump from the instantaneous frequency of modulation at the time of the switching that is triggered by the vibration response voltage from the capacitor reaching the predetermined threshold;

wherein said constant current circuit stabilizes the input electric signal and the output reaction voltage; and wherein said filter circuit singles out a vibration response voltage by removing the DC bias voltage from the reaction voltage.

11. The capacitor inspection apparatus according to claim 10, wherein said constant current circuit comprises a resistor and/or an inductor.

12. The capacitor inspection apparatus according to claim 10, wherein said filter circuit is an RC high-pass filter circuit comprising capacitors and resistors.

* * * * *